United States Patent

Koike et al.

[11] Patent Number: 6,056,443
[45] Date of Patent: *May 2, 2000

[54] GUIDE BUSH AND METHOD OF FORMING FILM OVER GUIDE BUSH

[75] Inventors: Ryota Koike, Tokorozawa; Yukio Miya, Kawagoe; Osamu Sugiyama, Tokorozawa; Takashi Toida, Tokyo; Toshiichi Sekine, Kamifukuoka, all of Japan

[73] Assignee: Citizen Watch Co., Ltd., Tokyo, Japan

[*] Notice: This patent is subject to a terminal disclaimer.

[21] Appl. No.: 09/043,032

[22] PCT Filed: Jul. 8, 1997

[86] PCT No.: PCT/JP97/02365

§ 371 Date: Mar. 6, 1998

§ 102(e) Date: Mar. 6, 1998

[87] PCT Pub. No.: WO98/01600

PCT Pub. Date: Jan. 15, 1998

[30] Foreign Application Priority Data

Jul. 8, 1996 [JP] Japan ................... 8-177847
Jul. 25, 1996 [JP] Japan ................... 8-196181
Aug. 15, 1996 [JP] Japan ................... 8-215558

[51] Int. Cl.[7] ............. F16C 17/02; B05D 7/22; C23C 16/26
[52] U.S. Cl. .............. 384/296; 384/907.1; 427/577
[58] Field of Search ................. 427/237, 238, 427/239, 249, 577; 384/907.1, 625, 275, 296

[56] References Cited

U.S. PATENT DOCUMENTS

| 5,879,763 | 3/1999 | Sugiyama et al. | 427/239 X |
| 5,922,418 | 7/1999 | Koike et al. | 427/577 |
| 5,939,152 | 8/1999 | Sugiyama et al. | 427/577 |
| 5,941,647 | 8/1999 | Koike et al. | 384/296 |

FOREIGN PATENT DOCUMENTS

| 55-70901 | 5/1980 | Japan . |
| 61-201780 | 9/1986 | Japan . |
| 63-241184 | 10/1988 | Japan . |
| 2-70059 | 3/1990 | Japan . |
| 4-141303 | 5/1992 | Japan . |
| 4-333577 | 11/1992 | Japan . |
| 6-346241 | 12/1994 | Japan . |
| 8-269718 | 10/1996 | Japan . |
| 9-31655 | 2/1997 | Japan . |

*Primary Examiner*—Thomas R. Hannon
*Attorney, Agent, or Firm*—Armstrong, Westerman, Hattori, McLeland & Naughton

[57] ABSTRACT

A hard carbon film (15) is formed directly or through an intermediate layer for enhancing adhesion over an inner surface ($11b$) and over a portion ($11h_1$) of an end face ($11h$) of a guide bush 11 adjacent to the end of the inner surface for holding a workpiece (51) rotatably and axially slidable on an automatic lathe at a position near a cutting tool, to be in sliding contact with the workpiece (51) or directly or through an intermediate layer for enhancing adhesion on the surface of a superhard lining fixed to the inner surface ($11b$) in a plasma CVD process employing an auxiliary electrode and a dummy member. Thereby, the guide bush (11) has remarkably enhanced durability and prevents seizing that makes a machining operation impossible, even when the guide bush (11) is used for an extended period of time and when the automatic lathe operates for heavy machining. Flaws caused by flashes on the workpiece are prevented from occurring on the inner surface of the guide bush (11).

19 Claims, 16 Drawing Sheets

GUIDE BUSH AND METHOD OF FORMING FILM OVER GUIDE BUSH

TECHNICAL FIELD

The present invention relates to a guide bush mounted in an automatic lathe to support a rodlike workpiece for rotation and axial sliding at a position near a cutting tool (cutter), and a method of forming a hard carbon film on a part of the guide bush to be in sliding contact with the workpiece.

BACKGROUND TECHNOLOGY

Guide bushes mounted on the column of an automatic lathe to hold a rodlike workpiece for rotation at a position near a cutting tool are classified into rotary guide bushes and stationary guide bushes. A rotary guide bush rotates together with a workpiece and holds the workpiece for axial sliding. A stationary guide bush remains stationary and holds a workpiece for rotation and axial sliding.

A guide bush of either type has a portion having a taper outer surface provided with slits to make the same portion elastic, a threaded portion to hold the guide bush on the column, and an inner surface for holding a workpiece. The inner surface always in sliding contact with a workpiece is liable to be worn and, particularly, the inner surface of a stationary guide bush is worn rapidly.

A guide bush proposed in JP-A No. 4-141303 has an inner surface to be in sliding contact with a workpiece, which slides and rotates on the inner surface, attached with a superhard alloy or a ceramic material attached to the inner surface by brazing or the like.

When the inner surface of a guide bush is attached with a superhard alloy or a ceramic material excellent in wear resistance and heat resistance, the wear of the inner surface of the guide bush can be reduced to some extent.

However, when the workpiece is subjected to heavy machining on an automatic lathe, in which the depth of cut is large and the cutting speed is high, the workpiece is damaged or seizing occurs due to decrease in the diametrical clearance between the guide bush and the workpiece even if the inner surface of the guide bush is attached with a superhard alloy or a ceramic material, because the superhard alloy and the ceramic material have a comparatively large coefficient of friction and a low thermal conductivity. Therefore, it has been difficult to increase the depth of cut and cutting speed.

The stationary guide bush has advantages that a workpiece can be accurately machined in a high roundness because the workpiece can be held so that its axis may not run out, less noise is generated, and the automatic lathe may be of a simple, compact construction.

However, the inner surface of the stationary guide bush is worn far more rapidly than that of the rotary guide bush and hence it is more difficult to increase depth of cut and cutting speed when the stationary guide bush is employed.

Further, in the automatic lathe, there frequently occurs a case where a part of the workpiece which has been once cut is drawn again in the guide bush and held, and it is subjected to machining again. In such a case, since small projections which are so-called flashes are frequently produced at the edge of the part of the workpiece, there is a problem that a flaw is produced at a portion adjacent to the edge of the inner surface of the bore of the guide bush and on the inner surface by the flash when the cut part is drawn in the guide bush. The flashes are frequently produced in the case where the workpiece is made of a material having high toughness which is hardly cut, which makes the aforementioned problem serious.

Accordingly, it is an object of the present invention to solve such problems so as to improve wear resistance of an inner surface of a guide bush to be in contact with a workpiece, and capable of enabling an automatic lathe to machine a workpiece at an increased depth of cut and an increased cutting speed without damaging the workpiece or causing seizure between the guide bush and the workpiece, and further, even when the part of the workpiece which has been cut is drawn into the guide bush so as to be subjected to machining again, the same guide bush can be made to be employed over a long period of time, eliminating the problem where a flaw is produced at a portion adjacent to the edge of the inner surface of the bore of the guide bush and on the inner surface by the flash.

DISCLOSURE OF THE INVENTION

With the foregoing object in view, the present invention provides a method of uniformly and firmly forming the hard carbon film in a short time over an inner surface of such a guide bush and a portion adjacent to an edge of the inner surface, and provides a guide bush having the inner surface and the portion adjacent to the edge of the inner surface to be in sliding contact with a workpiece, coated with a hard carbon film.

The hard carbon film is formed of a hydrogenated amorphous carbon closely resembling diamond in properties. Therefore, hydrogenated amorphous carbon is also called diamond like carbon (DLC).

The hard carbon film (DLC film) has a high hardness (not lower than Vickers 3000 Hv), is excellent in wear resistance and corrosion resistance, and has a small coefficient of friction (about ⅛ that of a superhard alloy).

The guide bush of the present invention having an inner surface to be in sliding contact with a workpiece, coated with the hard carbon film, has much better wear resistance than the conventional guide bush having an inner surface attached with a superhard alloy or a ceramic material.

Accordingly, if an automatic lathe employs the stationary guide bush of the present invention, it is possible to achieve heavy machining, in which depth of cut is large and cutting speed is high, with high accuracy for an extended period of time without damaging the workpiece and causing seizure.

Preferably, when the hard carbon film is formed on an intermediate layer formed over the inner surface of the guide bush and on the portion adjacent to the edge of the inner surface so as to enhance the adhesion between the inner surface and the hard carbon film, the hard carbon film can be formed more firmly and is hardly peeled off.

When the intermediate layer is formed of, for example, a two-layer film consisting of a lower layer of titanium or chromium and an upper layer of silicon carbide, the lower layer secures adhesion to the inner surface (alloy tool steel of the base material) of the guide bush, and the upper layer bonds firmly to the hard carbon film. Therefore, the hard carbon film adheres firmly to the inner surface of the guide bush with a high adhesion.

Thereby, an automatic lathe provided with this guide bush prevents peeling off of the hard carbon film even when the workpiece is subjected to heavy machining in which the depth of cut is large and the cutting speed is high.

Alternatively, a superhard lining containing at least tungsten, carbon and cobalt may be provided on the base material of the portion adjacent to the inner surface of the guide bush, or a carburized layer may be formed so as to form the hard carbon film over the superhard lining or over the inner surface of the carburized layer and the portion adjacent to the inner surface of the edge of the bore. An intermediate layer interposed between such a hard lining member and the hard carbon film will further enhance the adhesion of the hard carbon film.

A method of forming a hard carbon film over the inner surface of a guide bush in accordance with the present invention comprises the following steps.

A guide bush for use on an automatic lathe is placed in a vacuum vessel provided with a gas inlet port and an evacuation port, and provided therein with an anode and a filament, and then an auxiliary electrode having the shape of a rod or a wire is inserted in the center bore of the guide bush defined by the inner surface, to be in sliding contact with a workpiece, and the auxiliary electrode is connected to a ground potential or is applied with a positive DC voltage. The auxiliary electrode may be inserted in the center bore of the guide bush prior to placing the guide bush in the vacuum vessel.

A ringlike dummy member having a internal diameter larger than the diameter of the center bore of the guide bush is disposed on the end face of the guide bush boring at the inner surface so that the axis thereof is in alignment with that of the center bore while exposing the end face adjacent to the inner surface annularly.

A process gas containing carbon is supplied through the gas inlet port into the vacuum vessel after evacuating the vacuum vessel, and a hard carbon film is formed over the inner surface of the guide bush and the end face adjacent to the inner surface in a plasma CVD process by applying a DC voltage to the guide bush, a DC voltage to the anode and an AC voltage to the filament for producing plasma.

The plasma may be produced in the vacuum vessel by applying radio frequency power or a DC voltage to the guide bush without using the anode and the filament.

A hard carbon film of a uniform film thickness can be rapidly formed over the entire inner surface of the guide bush from the open end through the depth by supplying the process gas containing carbon into the vacuum vessel and producing the plasma after placing the guide bush provided with the auxiliary electrode inserted in the center bore thereof in the vacuum vessel.

Further, a hard carbon film can be formed annularly on the portion adjacent to the inner surface exposed by the dummy member as well as on the inner surface of the guide bush by disposing the ringlike dummy member having a internal diameter larger than that of the center bore of the guide bush on the end face of the guide bush boring at the inner surface which is in sliding contact with a workpiece in such a manner that the axis thereof is in alignment with that of the center bore.

BEST MODE FOR CARRYING OUT THE INVENTION

Preferred embodiments of the present invention will be described hereinafter.

Automatic Lathe Employing Guide Bush in accordance with the Present Invention

The construction of an automatic lathe employing a guide bush in accordance with the present invention will be briefly described.

Figure 29:
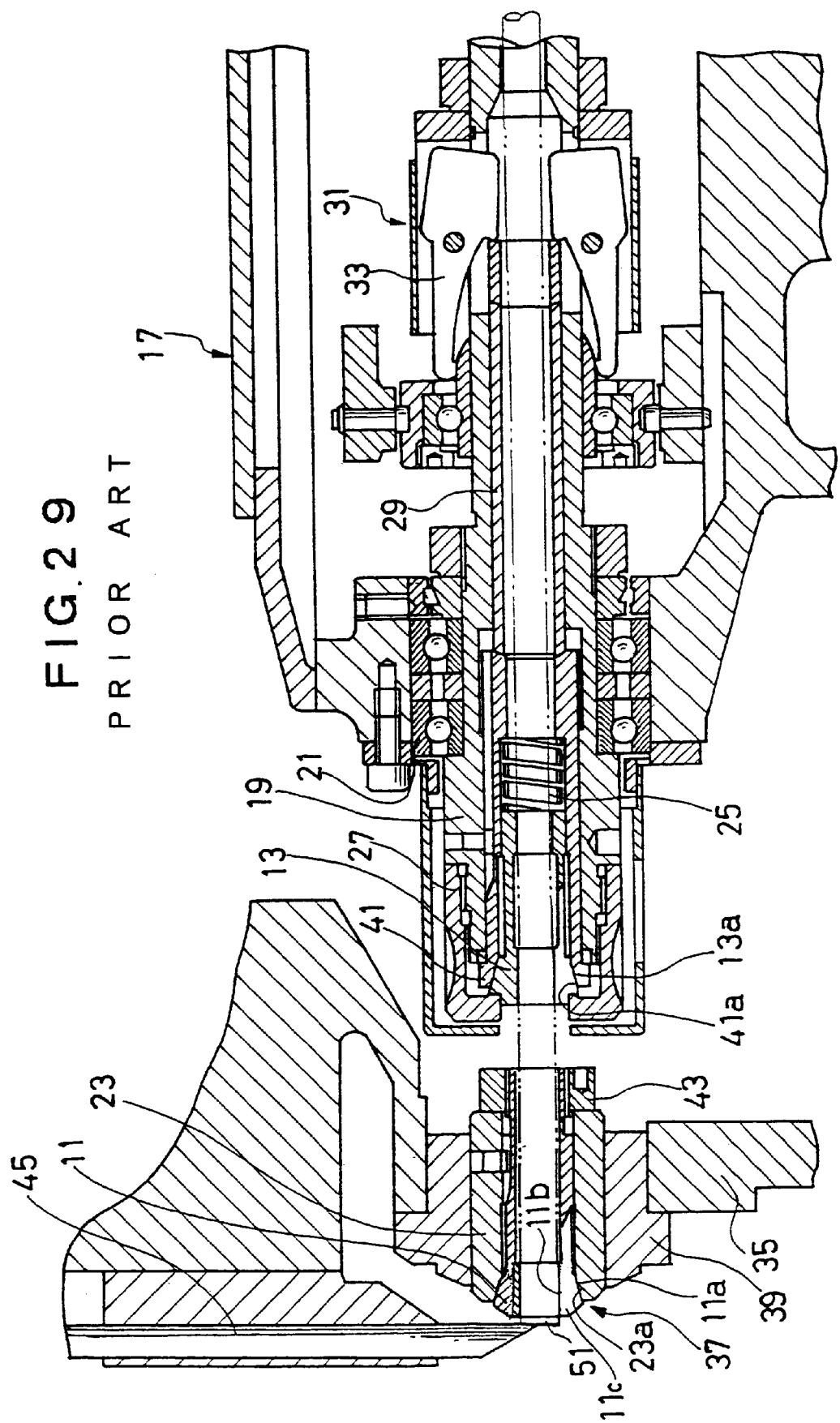
FIG. 29 is a sectional view of a spindle and associated parts included in an automatic lathe provided with a stationary guide bush unit employing a guide bush in accordance with the present invention.

Refer to FIG. 29 showing only a spindle and associated parts of a numerically controlled automatic lathe in a sectional view. The automatic lathe is provided with a stationary guide bush unit 37 that holds a guide bush 11 fixedly to support a workpiece 51 (indicated by imaginary lines) rotatably on the inner surface 11b of the guide bush 11.

A spindle stock 17 is mounted on the bed, not shown, of the numerically controlled automatic lathe for sliding movement in transverse directions, as viewed in FIG. 29.

A spindle 19 is supported for rotation in bearings 21 on the spindle stock 17, and a collet chuck 13 is mounted on the nose of the spindle 19.

The collet chuck 13 having a coned head having a taper outer surface 13a is inserted in the center bore of a chucking sleeve 41 with the taper outer surface 13a in close contact with a taper inner surface 41a formed in a front portion of the chucking sleeve 41.

A coil spring 25 formed by winding a spring band is inserted in an intermediate sleeve 29 at the back end of the collet chuck 13. The collet chuck 13 can be pushed out of the intermediate sleeve 29 by the action of the coil spring 25.

The position of the front end of the collet chuck 13 is determined by a cap nut 27 fastened to the front end of the spindle 19 with screws and in contact with the front end of the collet chuck 13. The cap nut 27 restrains the collet chuck 13 from being pushed out of the intermediate sleeve 29 by the force of the coil spring 25.

A chuck operating mechanism 31 provided with chuck operating levers 33 is provided on the back end of the intermediate sleeve 29. The chuck operating levers 33 are operated to open or close the collet chuck 13 so that the collet chuck 13 releases or chucks the workpiece 51.

When the chuck operating levers 33 of chuck operating mechanism 31 are turned so that the front ends thereof are moved away from each other, operating portions of the chuck operating levers 33 in contact with the intermediate sleeve 29 move to the left, as viewed in FIG. 29, to push the intermediate sleeve 29 to the left. Consequently, the chucking sleeve 41 in contact with the left end of the intermediate sleeve 29 moves to the left.

The collet chuck 13 is restrained from being pushed out of the spindle 19 by the cap nut 27 fastened to the front end of the spindle 19 with screws.

Therefore, when the chucking sleeve 41 is moved to the left, the taper inner surface 41a of the chucking sleeve 41 is pressed against the taper outer surface 13a of the slitted, coned head portion of the collet chuck 13 and the taper inner surface 41a of the chucking sleeve 41 moves to the left along the taper outer surface 13a of the collet chuck 13.

Consequently, the collet chuck 13 is compressed and the inside diameter of the collet chuck 13 is reduced to grip the workpiece 51.

When releasing the workpiece 51 from the collet chuck 13 by expanding the collet chuck 13 so that the inside diameter of the collet chuck 13 is increased, the chuck operating levers 33 are turned so that the front ends thereof are moved toward each other to remove the force acting to the left on the chucking sleeve 41.

Then, the intermediate sleeve 29 and the chucking sleeve 41 are moved to the right as viewed in FIG. 29 by the stored energy of the coil spring 25.

Consequently, the pressure applied to the taper outer surface 13a of the collet chuck 13 by the taper inner surface 41a of the chucking sleeve 41 is removed to allow the collet chuck 13 to expand by its own resilience, so that the inside diameter of the collet chuck 13 increases to release the workpiece 51.

A column 35 is disposed in front of the spindle stock 17 and the guide bush unit 37 is placed on the column 35 with its center axis aligned with that of the spindle.

The guide bush unit 37 is of a stationary type fixedly holding the guide bush 11 to support the workpiece 51 rotatably on the inner surface 11b of the guide bush 11.

A bush sleeve 23 is fitted in the center bore of a holder 39 fixed to the column 35. A taper inner surface 23a is formed in the front portion of the bush sleeve 23.

The guide bush 11 having a front portion provided with a taper outer surface 11a and slits 11c are fitted in the center bore of the bush sleeve 23.

The clearance between the inner surface of the guide bush 11 and the outer surface of the workpiece 51 can be adjusted by turning an adjusting nut 43 screwed on the threaded portion of the guide bush 11 and contiguous with the back end of the guide bush unit 37.

When the adjusting nut 43 is turned clockwise, the guide bush 11 moves to the right, as viewed in FIG. 29, relative to the bush sleeve 23 and he taper outer surface 11a of the guide bush 11, similar to the taper outer surface of the collet chuck 13, is compressed by the taper inner surface 23a of the bush sleeve 23 and the inside diameter of the slitted front portion of the guide bush 11 is reduced.

A cutting tool (cutter) 45 is disposed further in front of the guide bush unit 37.

The workpiece 51 is chucked by the collet chuck 13 mounted on the spindle 19 and supported by the guide bush unit 37. A portion of the workpiece 51 projecting from the guide bush unit 37 into a machining region is machined for predetermined machining by a combined motion of the cross feed motion of the cutting tool 45 and the longitudinal traverse motion of the spindle stock 17.

Figure 30:
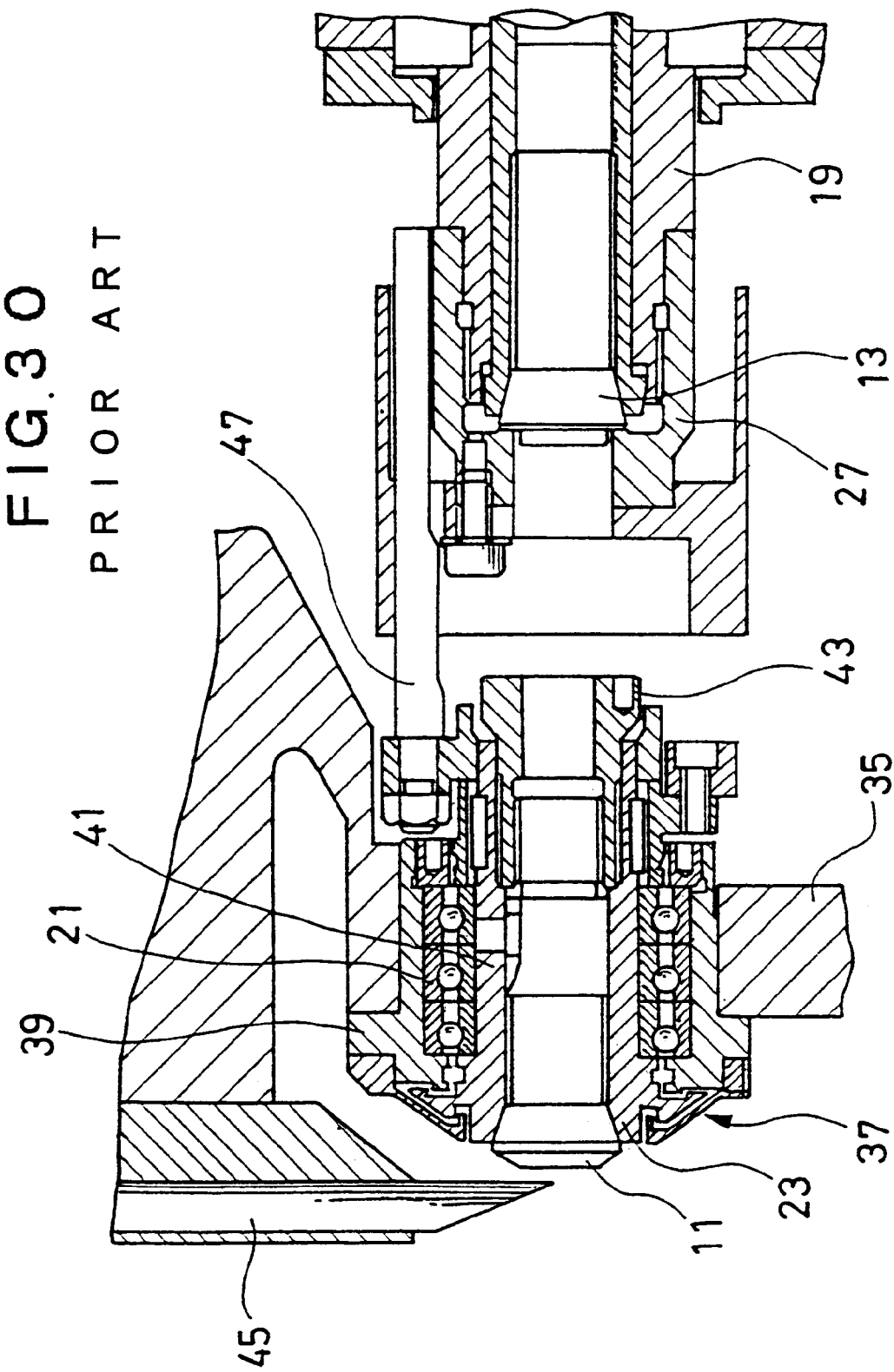
FIG. 30 is a sectional view of a spindle and associated parts included in an automatic lathe provided with a rotary guide bush unit employing a guide bush in accordance with the present invention.

A rotary guide bush unit that supports rotatably a guide bush gripping a workpiece will be described with reference to FIG. 30, in which parts like or corresponding to those shown in FIG. 29 are designated by the same reference characters.

Rotary guide bush units are classified into those holding a guide bush 11 so as to rotate in synchronism with the collet chuck 13 and those holding a guide bush 11 so as to rotate in asynchronism with the collet chuck 13. A guide bush unit 37 shown in FIG. 30 holds the guide bush 11 so as to rotate in synchronism with the collet chuck 13.

The rotary guide bush unit 37 is driven by a drive rod 47 projecting from the cap nut 27 mounted on the spindle 19. A gear mechanism or a belt-and-pulley mechanism may be used instead of the drive rod 47 for driving the guide bush unit 37.

The rotary guide bush unit 37 has a holder 39 fixed to a column 35. A bush sleeve 23 is inserted in the center bore of the holder 39 and is supported in bearings 21 on the holder 39, and the guide bush 11 is fitted in the center bore of the bush sleeve 23.

The bush sleeve 23 and the guide bush 11 are similar in construction to those illustrated in FIG. 29, respectively. The clearance between the inner surface of the guide bush 11 and the outer surface of the workpiece 51 can be adjusted by turning an adjusting nut 43 screwed on the threaded portion of the guide bush 11 which is contiguous with the back end of the guide bush unit 37.

This automatic lathe is the same in construction as the automatic lathe illustrated in FIG. 29 except that this automatic lathe is provided with the rotary guide bush unit 37, and hence the further description thereof will be omitted.

Guide Bush in accordance with the Present Invention

Guide bushes in preferred embodiments according to the present invention will be described hereinafter.

Figure 1:
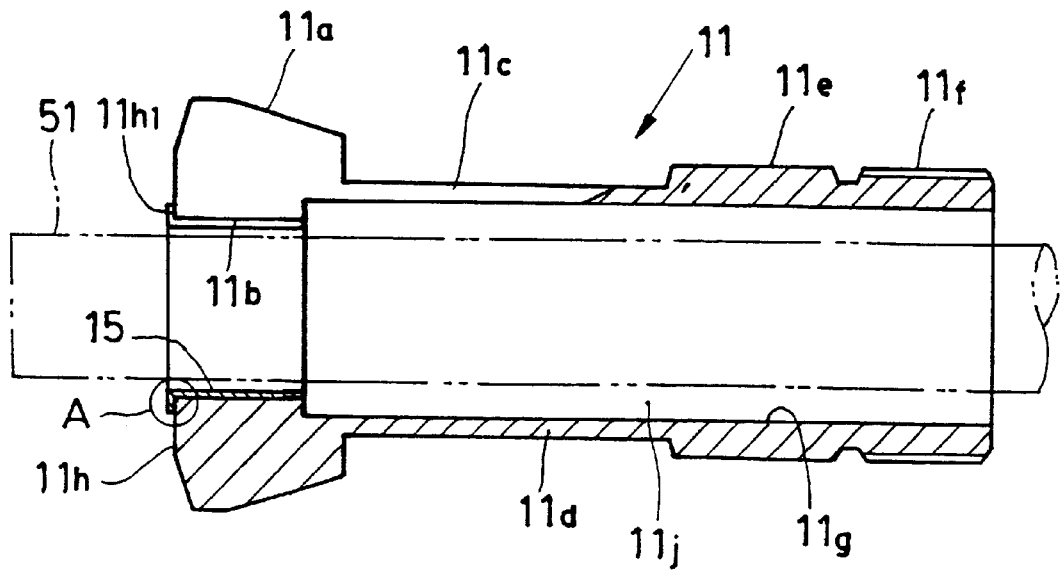
FIG. 1 is a longitudinal sectional view of a guide bush in a preferred embodiment according to the present invention.
Figure 2:
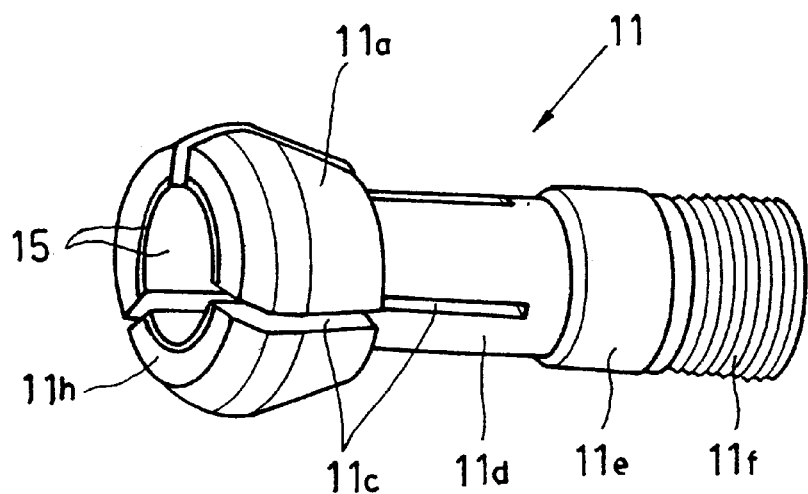
FIG. 2 is a perspective view of the guide bush of FIG. 1.

FIGS. 1 and 2 are a longitudinal sectional view and a perspective view, respectively, of a guide bush in a preferred embodiment according to the present invention.

Referring to FIGS. 1 and 2, a guide bush 11 is shown in a free state in which a front end portion is open. The guide bush 11 is formed substantially in a cylindrical shape having a center bore 11j along the axial line thereof and has a head portion having a taper outer surface 11a in one longitudinal end thereof, and a threaded portion 11f in the other longitudinal end thereof.

Further the center bore 11j of the guide bush 11 forms an inner surface 11b that holds a workpiece, inside the head portion having the taper outer surface 11a, and forms a stepped section 11g having the internal diameter greater than that of the inner surface 11b, in the region of the center bore other than the inner surface 11b.

Three slits 11c are formed at angular intervals of 120° so as to extend through the head portion having the taper outer surface 11a and an elastic bendable portion 11d.

The clearance between the inner surface 11b and the workpiece 51 indicated by imaginary lines in FIG. 1 can be adjusted by pressing the taper outer surface 11a of the guide bush 11 by the taper inner surface of the bush sleeve, so that the elastic bendable portion 11d is bent.

The guide bush 11 has a fitting portion 11e between the elastic bendable portion 11d and the threaded portion 11f. When the guide bush 11 is fitted in the center bore of the bush sleeve 23 (FIGS. 29 and 30), the fitting portion 11e fits the center bore closely to set the guide bush 11 with its axis in alignment with the center axis of the spindle.

The guide bush 11 is made of an alloy tool steel (SKS). When forming the guide bush 11, a workpiece of carbon tool steel is machined in predetermined external and internal shapes, and the machined workpiece is subjected to quenching and annealing.

When the head portion having the taper outer surface 11a is compressed, a clearance in the range of 5 to 10 μm is formed between the inner surface 11b and the workpiece 51 in the radial direction thereof to allow the workpiece 51 to slide relative to this guide bush 11, which abrades the inner surface 11b.

When the guide bush 11 is used on a stationary guide bush unit as shown in FIG. 29, the workpiece 51 supported on the guide bush 11 rotates at a high surface speed relative to the inner surface 11b and, when an excessively high pressure is applied to the inner surface 11b by the workpiece 51, seizing may occur.

There is also a problem that a flaw is produced on the inner surface of the guide bush or on the end face thereof when a workpiece which has been once cut is again drawn in the guide bush and held for machining as described before.

Therefore, the inner surface 11b of the guide bush 11 is coated with a hard carbon film (DLC film) 15 of a thickness in the range of 1 to 5 μm.

Further, a hard carbon film is also formed annularly on the portion $11h_1$ of the end face 11h of the guide bush 11 adjacent to the end of the inner surface 11b boring at the end face 11h.

In an example shown in FIG. 1, the hard carbon film 15 is formed directly on the substrate (alloy tool steel) of the guide bush 11, or is formed by way of an intermediate layer which will be described later.

Figure 3:
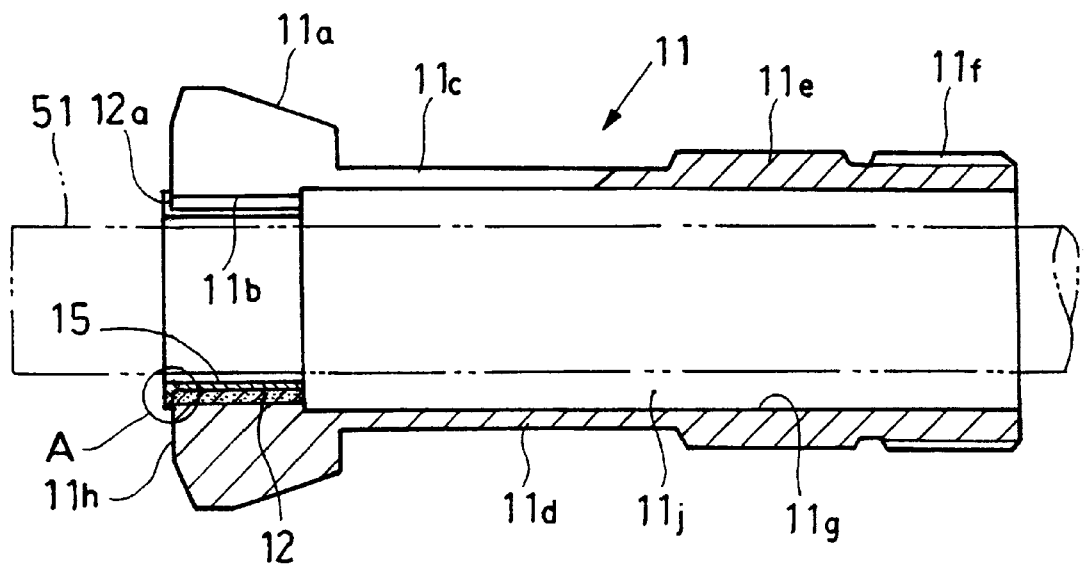
FIG. 3 and FIG. 4 are longitudinal sectional views respectively showing a guide bush in a different embodiment according to the present invention.

In an example shown in FIG. 3, a hard lining 12 of a thickness of 2 mm to 5 mm containing at least tungsten (W), carbon (C) and cobalt (Co) is attached to the inner surface 11b of the guide bush 11 by brazing, and the hard carbon film 15 is formed on the inner surface of the hard lining 12 and on the end face 12a of the hard lining 12 boring at a inner surface.

Figure 4:
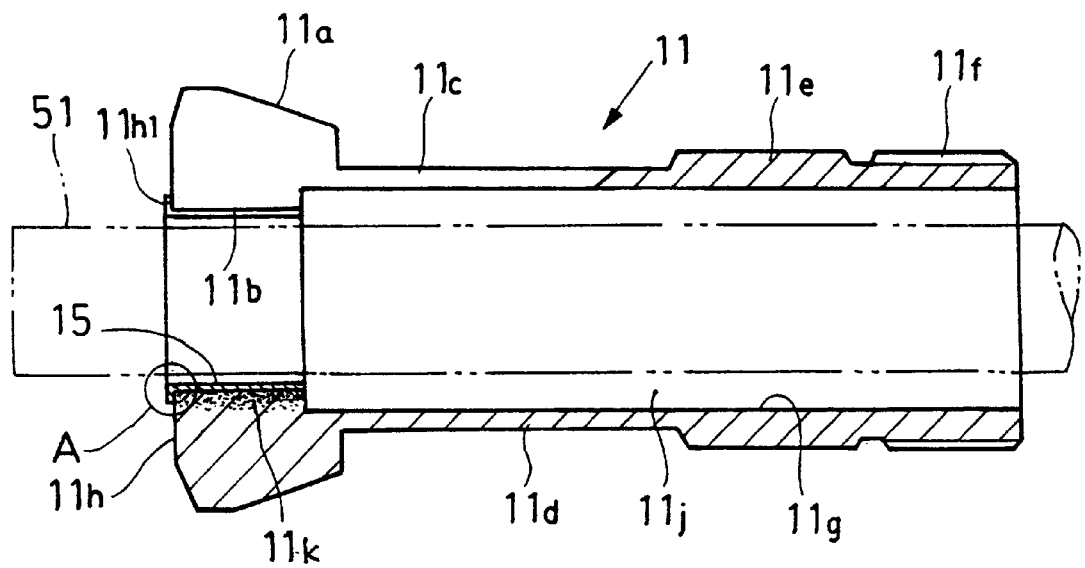

Further, in an example shown in FIG. 4, a carburized layer 11k is provided on the inner surface 11b of the guide bush 11 and on the portion $11h_1$ of the end face 11h of the guide bush 11 adjacent to the end of the inner surface boring at the end face 11h, and the hard carbon film 15 is formed on the carburized layer 11k.

The hard carbon film is very similar in properties to diamond; the hard carbon has a high mechanical strength, a small coefficient of friction, a satisfactory self-lubricity, a satisfactory electrical insulation characteristic, a high thermal conductivity and an excellent corrosion resistance.

The hard carbon film 15 covering the inner surface 11b and the portion $11h_1$ of the end face 11h of the guide bush 11 adjacent to the end of the inner surface enhance the wear resistance of the guide bush remarkably, the guide bush 11 withstands an extended period of use and heavy machining, the wear of the inner surface 11b in contact with the workpiece 51 is reduced, the possibility of exerting abrasive damage to the workpiece 51 and to the inner surface of the guide bush 11 and the inner edge of the end face thereof is reduced, and seizing between the guide bush 11 and the workpiece 51 can be avoided significantly.

Accordingly, the guide bush 11 of the present invention is capable of serving an extended period of use with remarkable improved reliability while properly functioning on the stationary guide bush unit.

Various structures of layers formed on the inner surface 11b of the guide bush 11 and the portion $11h_1$ of the end face 11h of the guide bush 11 adjacent to the end of the inner surface provided with the hard carbon film 15 will be described hereinafter with reference to FIGS. 5 to 13.

Figure 5:
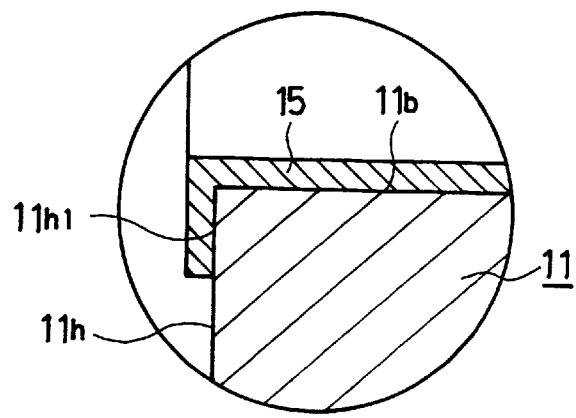
FIG. 5 to FIG. 13 are enlarged sectional views of portions surrounded by circles A in FIGS. 1, 3 and 4.
Figure 6:
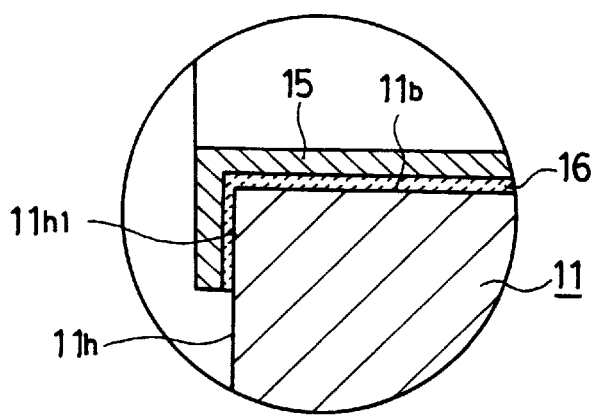
Figure 7:
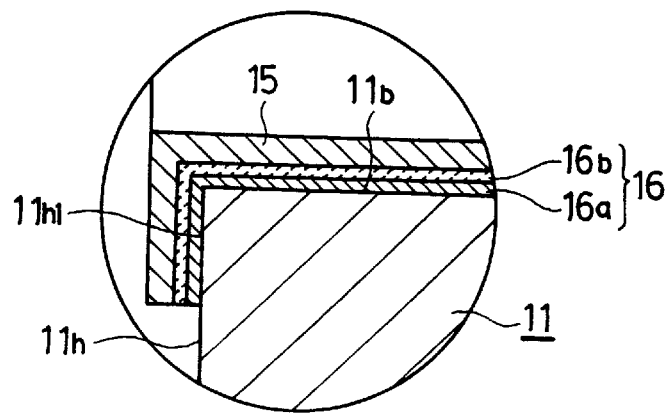

Referring to FIGS. 5 to 7 respectively showing a portion A in FIG. 1 in an enlarged view, FIG. 5 shows a hard carbon film 15 of a thickness in the range of 1 to 5 μm that is formed directly on the inner surface 11b of the guide bush 11 and the substrate (carbon tool steel) at the portion $11h_1$ of the end face 11h of the guide bush 11 adjacent to the end of the inner surface.

In FIG. 6, a hard carbon film 15 of a thickness in the range of 1 to 5 μm is formed on the inner surface 11b of the guide bush 11 and the substrate at the portion $11h_1$ of the end face 11h of the guide bush 11 adjacent to the end of the inner surface by way of an intermediate layer 16 to enhance the adhesion with the hard carbon film 15.

The intermediate layer 16 may be formed of an element of group IVb in the periodic table of elements, such as silicon (Si) or germanium (Ge), a compound containing silicon or germanium. Otherwise, a compound containing carbon such as a silicon carbide (SiC) or titanium carbide (TiC) may be employed.

FIG. 7 shows the intermediate layer 16 formed of two layers, i.e., a lower layer 16a of titanium (Ti) or chromium (Cr) and an upper layer 16b of silicon carbide (SiC).

In such a manner, the titanium or the chromium of the lower layer 16a serves so as to enhance the adhesion with the substrate of the guide bush 11 while the silicon carbide (SiC) of the upper layer 16b forms a covalent bond with the hard carbon film so as to serve to bond firmly to the hard carbon film.

This is because the titanium (Ti) and the chromium (Cr) have strong adhesion with the alloy tool steel forming the guide bush 11, and since the silicon and the carbon forming the silicon carbide (SiC) are both elements belonging to group IVb in the periodic table of elements, while the hard carbon film is also formed of carbon, both of which have a diamond-structure, both films can be bonded with strong adhesion.

Figure 8:
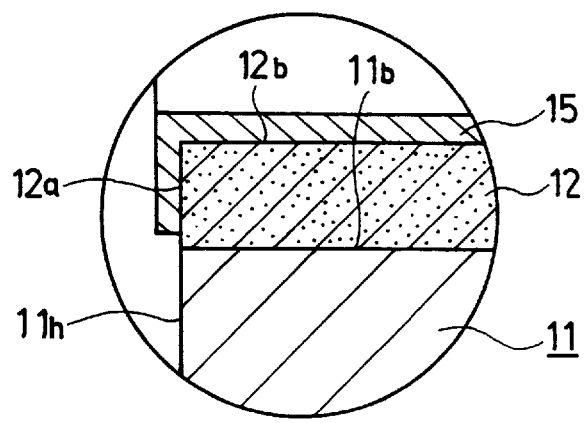
Figure 9:
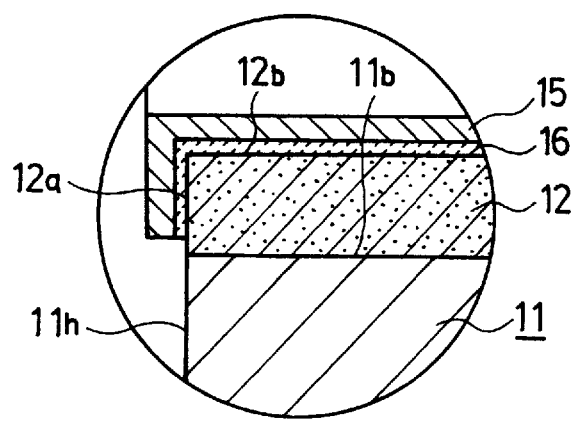
Figure 10:
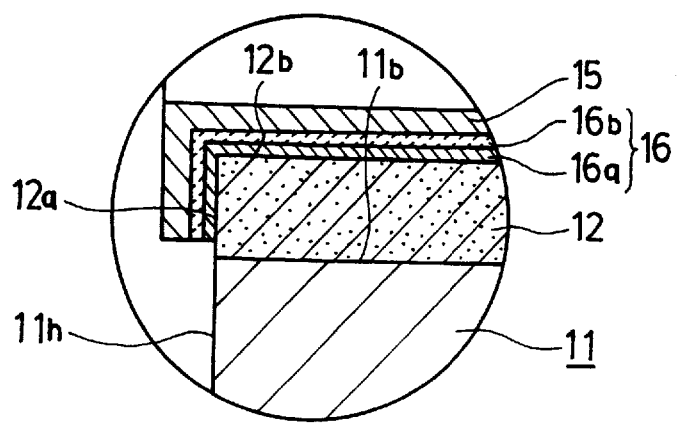

Refer to FIGS. 8 to 10 respectively showing a portion A in FIG. 3 in an enlarged view, in which a superhard lining 12 of a thickness in the range of 2 to 5 mm is formed on the substrate of the inner surface 11b of the guide bush 11 by brazing, and the hard carbon film 15 is formed on the inner surface 12b and on the end face 12a at the opening side of the bore. Thereby, durability of the guide bush 11 can be further enhanced.

In an example shown in FIG. 9, a hard carbon film 15 is formed on the inner surface 12b of the superhard lining 12 and on the end face 12a by way of the intermediate layer 16 to further enhance adhesion. The intermediate layer 16 is formed, for example, of carbonized tungsten (WC).

In an example shown in FIG. 10, the intermediate layer 16 comprises two-layer films of the lower layer 16a of titanium (Ti) or chromium (Cr) and the upper layer 16b of silicon carbide (SiC).

Or, the lower layer 16a of the intermediate layer 16 may be formed of carbonized tungsten while the upper layer 16b may be formed of silicon carbide.

In these examples, a superhard lining containing at least tungsten, carbon and cobalt is employed as the superhard lining 12 provided on the lower layer of the hard carbon film 15. For example, the composition is 85% to 90% tungsten (W), 5% to 7% carbon (C), and 3% to 10% cobalt (Co) as a binder.

Also, a superhard alloy such as tungsten carbide (WC) or a sintered material such as silicon carbide (SiC) may be employed. In sintering ceramics, chromium (Cr), nickel (Ni), and cobalt (Co) are added as a binder, and when the added quantity is small, the hard carbon film 15 may be formed directly on the superhard lining 12 without the intermediate layer 16 interposed as shown in FIG. 8.

However, if the hard carbon film 15 is formed directly on the superhard alloy as described before, it is affected by the binder or the like (particularly, cobalt (Co)) employed for forming the superhard alloy, and the hard carbon film 15 may peel off.

Therefore, it is preferable to form the intermediate layer 16 for enhancing adhesion between the superhard lining 12 and the hard carbon film 15 as shown in FIG. 9 or FIG. 10.

Thus, when the hard carbon film 15 is formed with the intermediate layer 16 interposed, the superhard lining 12 is prevented from directly touching the binder, thereby preventing peeling off of the hard carbon film 15 without any adverse effect.

Figure 11:
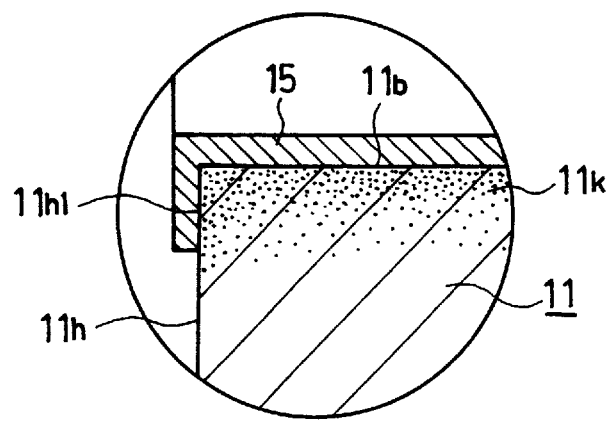
Figure 12:
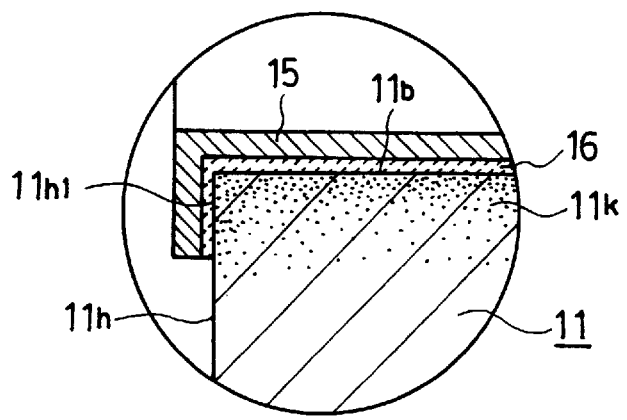
Figure 13:
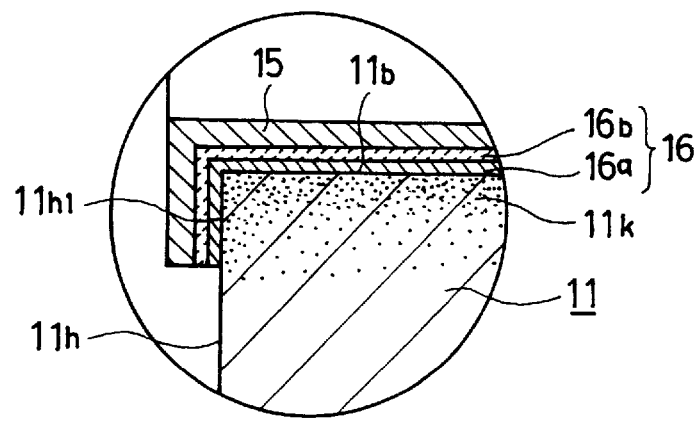

FIG. 11 to FIG. 13 are enlarged sectional views of portions surrounded by circles A in FIG. 3, in which a carburized layer 11$k$ is formed on the substrate near the inner surface 11$b$, and the hard carbon film 15 is formed on the inner surface 11$b$ on which the carburized layer 11$k$ is formed and on the portion 11$h_1$ of the end face of the guide bush 11 adjacent to the end of the inner surface, instead of the superhard lining 12.

Carburization is one generally known surface hardening process that hardens a surface layer of a ferrous alloy maintaining the high toughness of the ferrous alloy.

In this example, the guide bush 11 is carburized in an atmosphere of a mixed gas of a carbonaceous gas, such as methane ($CH_4$) or ethylene ($C_2H_4$) and nitrogen gas ($N_2$) as a carrier gas under the following conditions.

| Carburizing Conditions: | |
|---|---|
| Temperature | 1100° C. |
| Time | 30 min |
| Depth of carburization | 0.5 mm |

When the guide bush 11 is provided with the carburized layer 11$k$ in the surface layer of the inner surface 11$b$, the hard carbon film 15 may be formed directly on the inner surface as shown in FIG. 11. However, it is preferable to form the hard carbon film 15 on an intermediate layer 16 formed on the inner surface 11$b$ to enhance the adhesion as shown in FIG. 12 or FIG. 13.

An element of group lVb in the periodic table of elements, such as silicon (Si) or germanium (Ge), or a compound containing silicon or germanium may be employed as the intermediate layer 16.

The intermediate layer 16 may be a two-layer film consisting of a lower layer 16$a$ of titanium (Ti) or chromium (Cr), and an upper layer 16$b$ of silicon carbide (SiC) as shown in FIG. 13.

The lower layer 16$a$ of titanium or chromium of the intermediate layer 16 enhances adhesion to the substrate of the guide bush 11, and the upper layer 16$b$ of silicon carbide and the hard carbon film 15 form covalent bonding, which prevents the peeling off of the hard carbon film.

Figure 14:
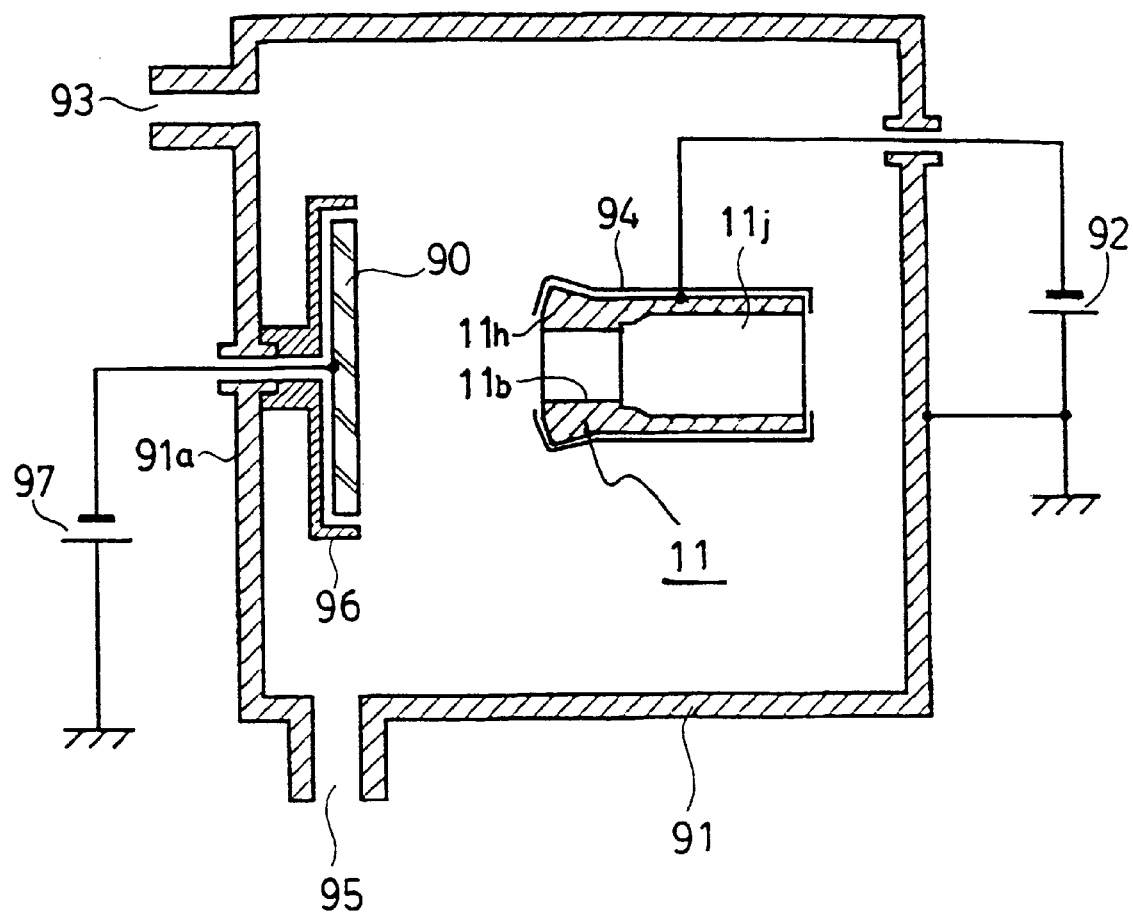
FIG. 14 is a sectional view for explanation of a method of forming an intermediate layer over a guide bush.

Explanation of Method of Forming Intermediate Layer: FIG. 14

The above-mentioned method of forming the intermediate layer 16 on the inner surface 11$b$ of the guide bush 11 and on the portion 11$h_1$ of the end face of the guide bush 11 adjacent to the end of the inner surface will be described next.

The intermediate layer may be formed by a sputtering process, an ion plating process, a chemical vapor deposition (CVD) process or a metal spraying process.

The method of forming the intermediate layer in the sputtering process will be described with reference to FIG. 14 as an example thereof.

A target cover 96 is provided on a wall surface 91$a$ of a vacuum vessel 91 having a gas inlet port 93 and an evacuation port 95, and a target 90 to be a material of the intermediate layer is placed thereon. The guide bush 11 is disposed so that the target 90 faces the end face 11$h_1$. At this time, the guide bush 11 is placed with the axis of the center bore 11$j$ thereof perpendicular to the surface of the target 90.

A covering member 94 of an aluminum foil or the like is placed to cover the outer surface except the portion 11$h_1$ of the end face 11$h$ of the guide bush 11 adjacent to the end of the inner surface.

The guide bush 11 is connected with a DC power source 92, while the target 90 is connected with a target power source 97.

After such a setting, the vacuum vessel 91 is evacuated to a vacuum of less than $3 \times 10^{-5}$ torr by pumping the gas through the evacuation port 95 by an evacuation means, not shown.

After this, argon (Ar) gas as a sputtering gas is introduced through the gas inlet port 93 so that the pressure in the vacuum vessel 91 is maintained at a vacuum of $3 \times 10^{-3}$ torr.

A DC voltage of $-60$ V is applied to the guide bush 11 by the DC power source 92, and a DC voltage of $-50$ V is applied to the target 90 by the target power source 97.

Then, a plasma is produced in the vacuum vessel 91 and the surface of the target 90 is subjected to sputtering by the ions in the plasma. Thereby, the material to be the intermediate layer is sputtered out of the surface of the target 90 and adheres to the portion not covered with the covering member 94 of the guide bush 11, and the intermediate layer 16 described before can be formed only on the inner surface 11$b$ and on the portion 11$h_1$ of the end face 11$h$ of the guide bush 11 adjacent to the end of the inner surface.

On the other hand, in the case of a guide bush provided with a superhard lining 12 on the inner surface 11$b$, the intermediate layer 16 can be formed on the inner surface 12$b$ of the superhard lining 12 and on the end face 12$a$.

The thickness of intermediate layer 16 is to be about 0.5 $\mu$m. However, in the case of the intermediate layer consisting of two layers, the thickness of both the upper and lower layers is to be about 0.5 $\mu$m.

When an intermediate layer consisting of a single layer is formed, silicon carbide (SiC) or tungsten carbide (WC) is employed as the target 90. When an intermediate layer consisting of two layers is formed, the target 90 is subjected to sputtering by employing titanium (Ti) or chromium (Cr) so as to form the lower layer of the intermediate layer, and then the target 90 is subjected to sputtering by employing silicon carbide (SiC) so as to form the upper layer of the intermediate layer.

Explanation of Method of Forming Hard Carbon Film

A method of forming the hard carbon film on a guide bush, in a preferred embodiment according to the present invention will be described next with reference to FIGS. 15 to 28.

Firstly, a method of producing a guide bush 11 in a state where the hard carbon film is not yet formed thereon will be described.

The guide bush 11 is formed by machining a workpiece of an alloy tool steel (SKS) so as to form the taper outer surface 11a, the elastic bendable portion 11d, the fitting portion 11e, the threaded portion 11f, the center bore 11j, the inner surface 11b formed in a portion of the center bore 11j, and an stepped section 11g of the center bore 11j, having an internal diameter greater than that of the inner surface 11b.

The slits 11c are formed at angular intervals of 120° so as to extend through the head portion having the taper outer surface 11a by electric discharge machining.

The inner surface 11b, the taper outer surface 11a and the fitting portion 11e are ground to complete the guide bush 11 in a stage before forming the hard carbon film thereon.

The superhard lining 12 is attached to, or the carburized layer 11k is formed on, the inner surface 11b of the guide bush 11 when needed.

Also, the intermediate layer 16 is formed previously on the inner surface of the guide bush 11 and on the portion $11h_1$ of the end face of the guide bush 11 adjacent to the end of the inner surface or on the inner surface 12b of the superhard lining 12 and on the end face 12a.

Figure 15:
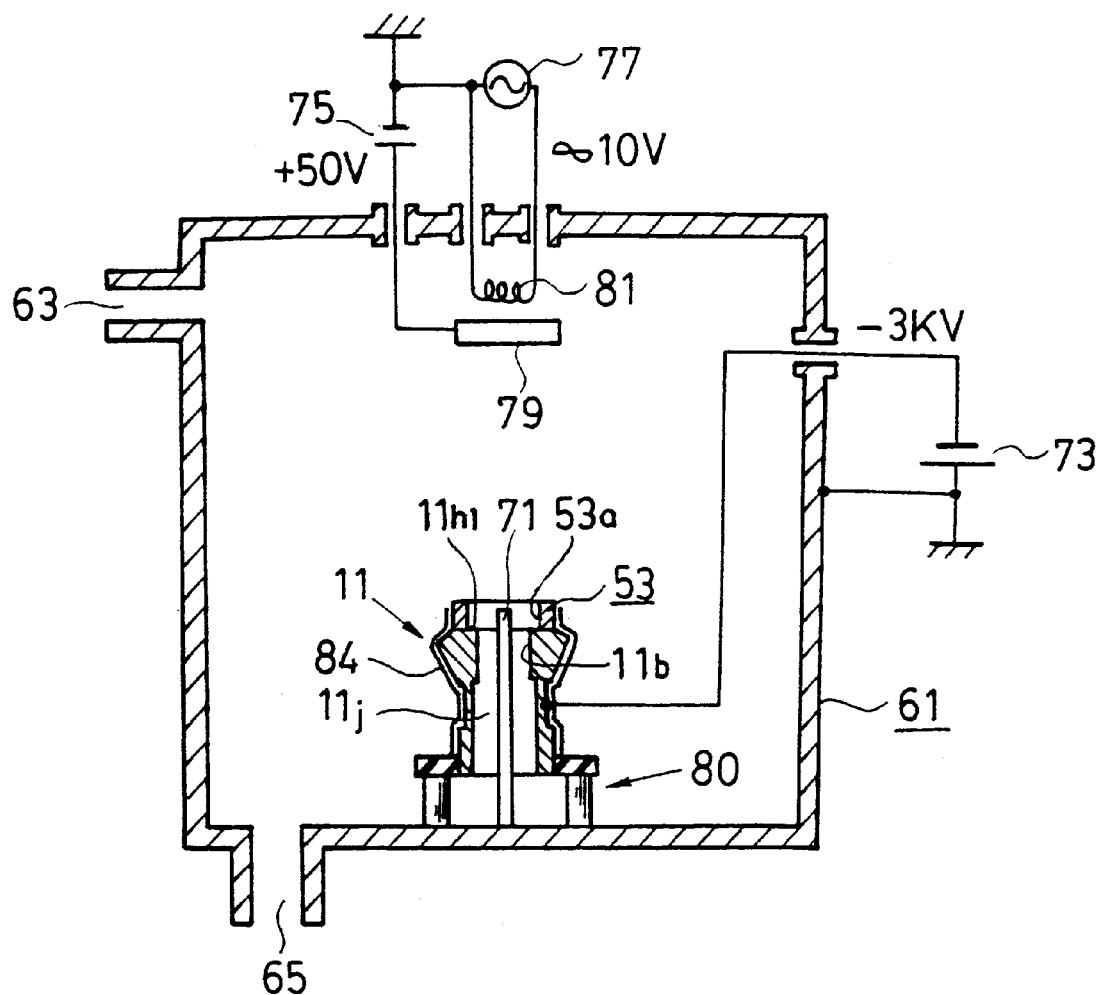
FIG. 15 is a schematic sectional view of an apparatus for carrying out a method of forming a hard carbon film over a guide bush according to the present invention.
Figure 16:
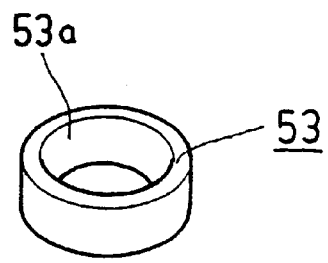
FIG. 16 is a perspective view of a dummy member employed in the embodiment of FIG. 15.

First Method: FIGS. 15 and 16

FIG. 15 is a schematic sectional view of an apparatus for carrying out a method of forming a hard carbon film over a guide bush according to the present invention.

In FIG. 15, denoted by 61 is a vacuum vessel provided with a gas inlet port 63 and an evacuation port 65. An anode 79 and a filament 81 are disposed in the upper central region of the inner space of the vacuum vessel 61. The guide bush 11 is mounted fixedly in an upright position on an insulating support 80 disposed in the lower central region of the inner space of the vacuum vessel 61.

An auxiliary electrode 71 having the shape of a thin rod is disposed in the vacuum vessel 61 so as to extend in the center bore 11j of the guide bush 11 substantially coaxially with the center bore 11j of the guide bush 11 and is connected through the vacuum vessel 61 to a ground potential. The auxiliary electrode 71 is made of metalic material such as stainless steel or the like.

Further, a ringlike dummy member 53 having an opening 53a with a diameter larger than that of the inner surface 11b of the guide bush 11 by 2 mm is placed on the end face 11h where the inner surface 11b of the guide bush 11 opens in such a manner that the axis thereof is in alignment with the center of the axis bore 11j, and the portion $11h_1$ of the end face 11h of the guide bush 11 adjacent to the end of the inner surface is exposed annularly.

The outer shape of the dummy member 53 is shown in FIG. 16. The dummy member 53 is also formed of stainless steel (SUS) in a manner similar to forming the auxiliary electrode 71. The outer dimension of the dummy member 53 is substantially the same as that of the end face 11 of the guide bush 11.

Incidentally, the auxiliary electrode 71 is desirably about 1 mm to 2 mm inside the guide bush 11 from the end face thereof so that the extremity thereof may not protrude from the upper end face of the dummy member 53.

If the outer surface of the guide bush 11 is covered by a covering member 84 of an aluminum foil or the like, the hard carbon film is not formed on the outer surface.

The vacuum vessel 61 is evacuated to a vacuum of $3 \times 10^{-5}$ torr by pumping out gases through the evacuation port 65.

Thereafter, benzene gas ($C_6H_6$), i.e., a gas containing carbon, is supplied through the gas inlet port 63 into the vacuum vessel 61 so that the pressure in the vacuum vessel 61 is maintained at a vacuum of $5 \times 10^{-3}$ torr.

Subsequently, a DC voltage of −3 kV is applied to the guide bush 11 by a DC power source 73, a DC voltage of +50 V is applied to the anode 79 by an anode power source 75, and further an AC voltage of about 10 V is applied to the filament 81 by a filament power source 77 so that a current of 30A flows thereto.

Thereby, a plasma is produced in a region surrounding the guide bush 11 disposed within the vacuum vessel 61 to form a hard carbon film only on the exposed inner surface 11b of the guide bush 11 and portion $11h_1$ of the end face 11h of the guide bush 11 adjacent to the end of the inner surface.

The hard carbon film forming method illustrated in FIG. 15 is able to produce the plasma not only around the outer surface of the guide bush but also around the inner surface of the same because the auxiliary electrode 71 is extended in the center bore 11j of the guide bush 11.

Therefore, hollow cathode discharge does not occur and the adhesion of the hard carbon film 15 is improved.

Since the distribution of potential with respect to the length of the inner surface of the guide bush 11 is uniform, the hard carbon film can be formed in a uniform thickness over the inner surface 11b. Since the hard carbon film is deposited at a high deposition rate, the hard carbon film having a uniform thickness from the open end through the depth can be formed in a short time.

The auxiliary electrode 71 may be of any diameter provided that the diameter is less than the diameter of the bore of the guide bush 11. Desirably, the diameter of the auxiliary electrode 71 is determined so that a clearance of about 5 mm, i.e., a clearance for creating a plasma region, is formed between the auxiliary electrode 71 and the inner surface 11b on which the hard carbon film is formed. Desirably, the ratio of the diameter of the auxiliary electrode 71 to the diameter of the bore of the guide bush 11 is not greater than 1/10. When the auxiliary electrode 71 is to be formed in a small diameter, the same may be a wire.

Although the auxiliary electrode 71 in this embodiment is formed of a stainless steel, the same may be formed of a metal having a high melting point, such as tungsten (W) or tantalum (Ta). The auxiliary electrode 71 has a circular cross section.

The dummy member 53 used in this embodiment performs the following function.

That is, in the method of forming a hard carbon film on the guide bush 11, a plasma is produced over the inner surface and outer periphery of the guide bush 11. Since charge is liable to concentrate at the end face of the guide bush 11 and the end face holds high potential compared with the inner surface thereof, a so-called edge effect is produced. The intensity of the plasma at the portion adjacent to the end face of the guide bush 11 is greater than that at the other portions and is unstable.

Further, the portion adjacent to the end face of the guide bush 11 is influenced by both plasmas, i.e., the inner plasma and the outer plasma.

When the hard carbon film is formed in such a state, the adhesion of the hard carbon film on the portion remote from the end face 11h of the guide bush 11 by several mm is slightly different from that on the other portions, and the quality of the film is also different.

Accordingly, if the dummy member 53 is disposed on the end face 11h through which the inner surface 11b of the guide bush 11 opens to form the hard carbon film as shown in FIG. 15, a portion where the quality of the film and the adhesion thereof are differentiated is not formed on the inner surface of the guide bush 11 but is instead formed on the inner surface of the bore of the dummy member 53.

Further, there occurs a problem that if the diameter of the bore formed by the inner surface of the guide bush 11 decreases to about 10 mm or less, the plasma produced between the auxiliary electrode 71 and the inner surface 11b of the guide bush is made unstable as time elapses so that the hard carbon film is not formed.

It is possible to prevent the plasma from becoming unstable by inducing a plasma in the opening 53a of the dummy member 53 having a diameter of bore which is larger than that of the bore formed by the inner surface 11b of the guide bush 11.

This is caused by the fact that the plasma is always stably produced in the opening 53a of the dummy member 53 having a diameter larger than that of the bore of the inner surface of the guide bush.

Thus, the stable hard carbon film can be formed on the annular portion $11h_1$ of the end face $11h$ adjacent to the end of the inner surface which is exposed inside the opening 53a of the dummy member 53 at the end face of the guide bush 11 owing to the plasma produced in the opening 53a of the dummy member 53. Further, it is possible to form the stable hard carbon film on the inner surface 11b by introducing the plasma generated in the opening 53a of the dummy member 53 into the center bore 11j of the guide bush 11.

As a result, the conventional problem in which flashes are produced at the edge of the workpiece is substantially prevented when a part of the workpiece which has been cut is drawn into the guide bush so as to be held for machining in the cutting process holding the workpiece.

Figure 17:
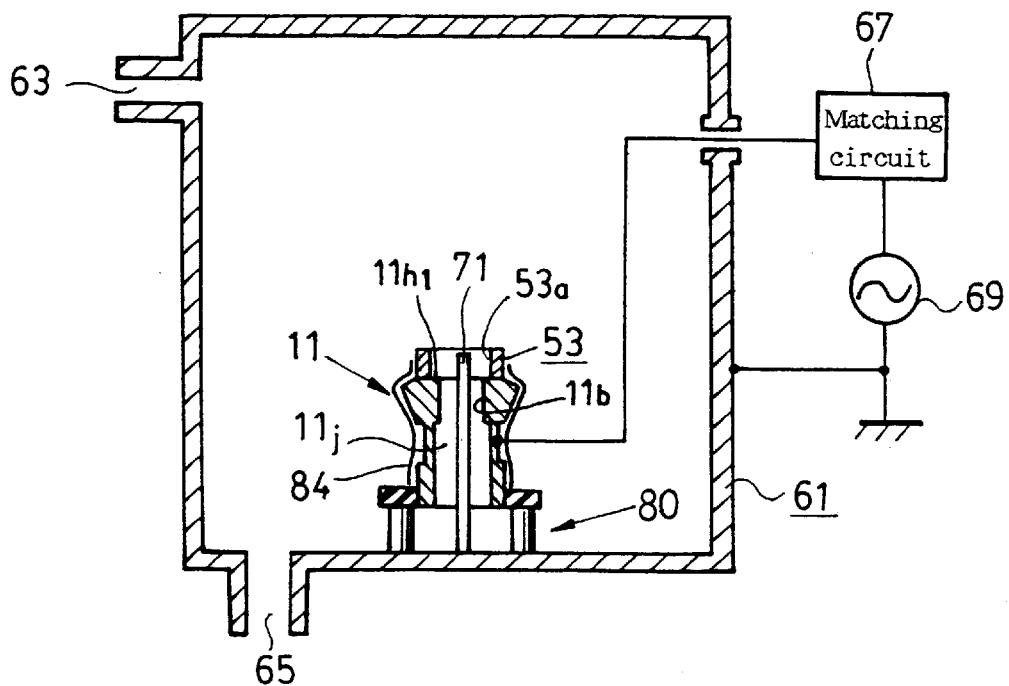
FIGS. 17 to 21 are schematic sectional views of other different apparatuses for carrying out a method of forming the hard carbon film over a guide bush according to the present invention.

Second Method: FIG. 17

Next, a hard carbon film forming method in a second embodiment will be described with reference to FIG. 17 which is different from the above method.

FIG. 17 is a sectional view of an apparatus for carrying out the second method. In FIG. 17, parts like or corresponding to those shown in FIG. 15 are designated by the same reference characters, and the description thereof is omitted.

The vacuum vessel 61 employed in the second method is not provided therein with an anode and a filament.

This hard carbon film forming method is different from the first method which employs the apparatus illustrated in FIG. 15 only in that radio frequency power is applied to a guide bush 11 disposed in the vacuum vessel 61 through a matching circuit 67 by a radio frequency power source 69 of 13.56 MHz oscillation frequency, with the dummy member 53 placed on the end face thereof and a grounded auxiliary electrode 71 therein, and methane gas ($CH_4$) as a gas containing carbon is supplied into the vacuum vessel 61 so that the pressure in the vacuum vessel 61 is maintained at a vacuum of 0.1 torr.

A plasma is produced around both the outer and the inner surface and a hard carbon film is formed on the inner surface 11b of the guide bush 11 and portion $11h_1$ of the end face of the guide bush 11 adjacent to the end of the inner surface in the plasma CVD process. The hard carbon film 15 can be formed in a substantially uniform thickness over the entire length of the inner surface 11b which is facing the auxiliary electrode 71 in a short time.

Figure 18:
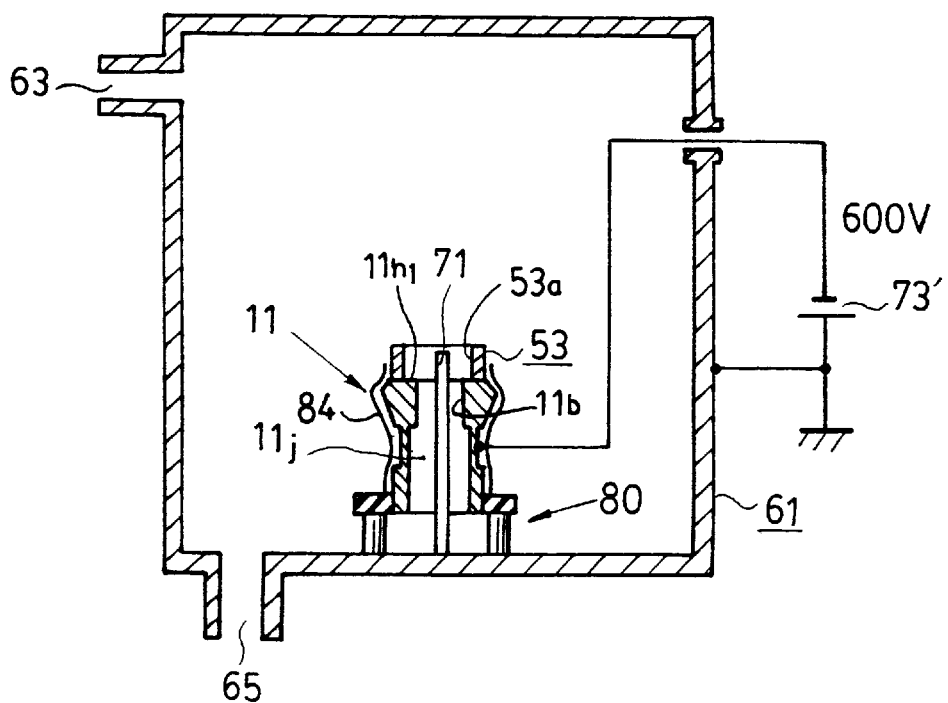

Third Method: FIG. 18

Next, a hard carbon film forming method in a third embodiment will be described with reference to FIG. 18 which is different from the above method.

FIG. 18 is a schematic sectional view of an apparatus for carrying out the third method. In FIG. 18, parts like or corresponding to those shown in FIG. 15 are designated by the same reference characters, and the description thereof is omitted.

The vacuum vessel 61 employed in the third method is not provided therein with an anode and a filament.

This hard carbon film forming method is different from the first method which employs the apparatus illustrated in FIG. 15 only in that a DC voltage of −600 V is applied to a guide bush 11 disposed in the vacuum vessel 61 by a DC power source 73' with the dummy member 53 placed on the end face thereof and a grounded auxiliary electrode 71 therein, and methane gas ($CH_4$) as a gas containing carbon is supplied into the vacuum vessel 61 so that the pressure in the vacuum vessel 61 is maintained at a vacuum of 0.1 torr.

A plasma is produced around both the outer and the inner surface and a hard carbon film is formed on the inner surface 11b of the guide bush 11 and portion $11h_1$ of the end face of the guide bush 11 adjacent to the end of the inner surface in the plasma CVD process. The hard carbon film 15 can be formed in a substantially uniform thickness over the entire length of the inner surface 11b which is facing the auxiliary electrode 71 in a short time.

These previously described hard carbon film forming methods are applicable to forming the hard carbon film 15 over the guide bush 11 in the foregoing layered structures described with reference to FIGS. 1 to 13.

Although the foregoing hard carbon film forming methods embodying the present invention use methane gas or benzene gas as a gas containing carbon, ethylene containing carbon or a vapor of a liquid containing carbon, such as hexane, may be used instead of methane gas or benzene gas.

Figure 19:
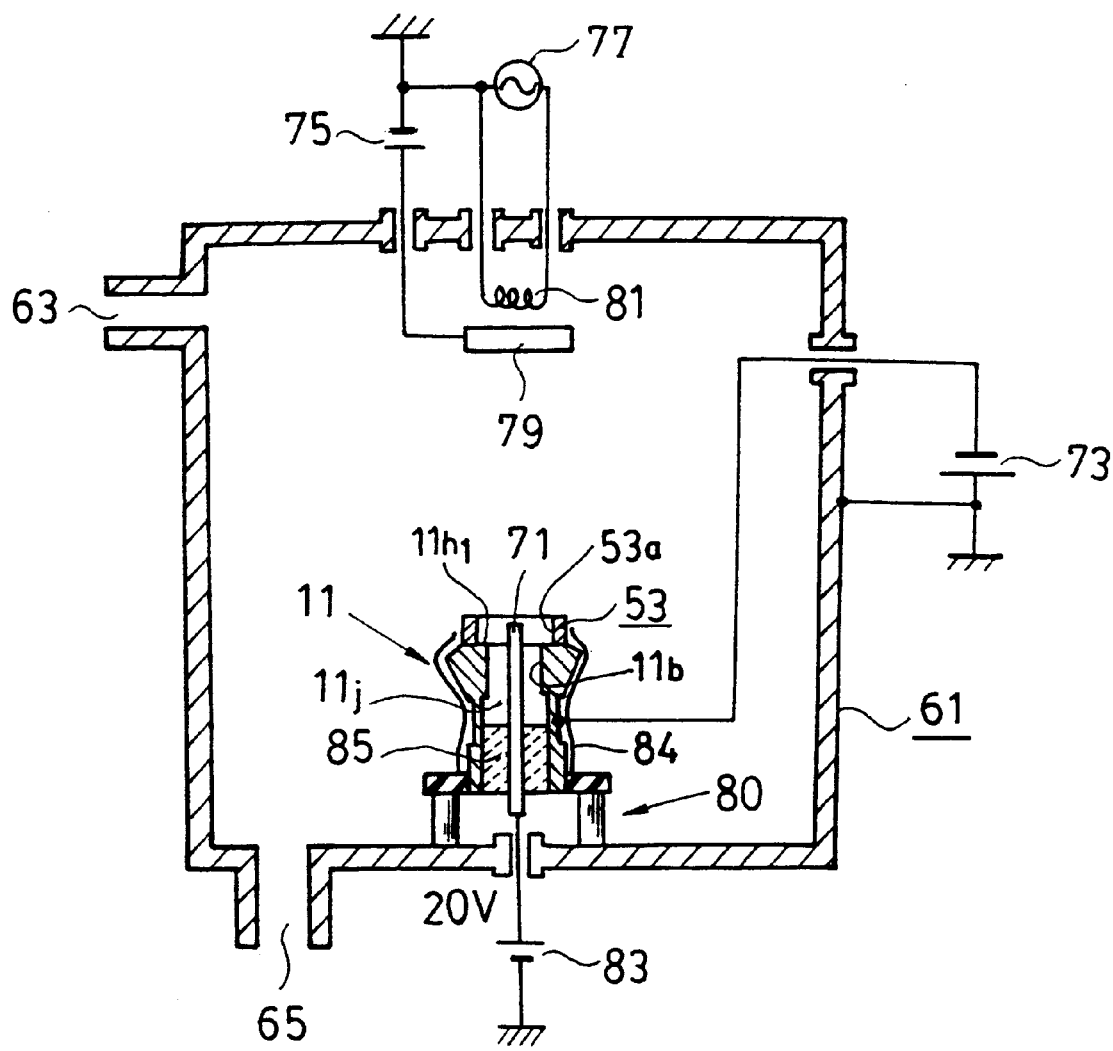
Figure 20:
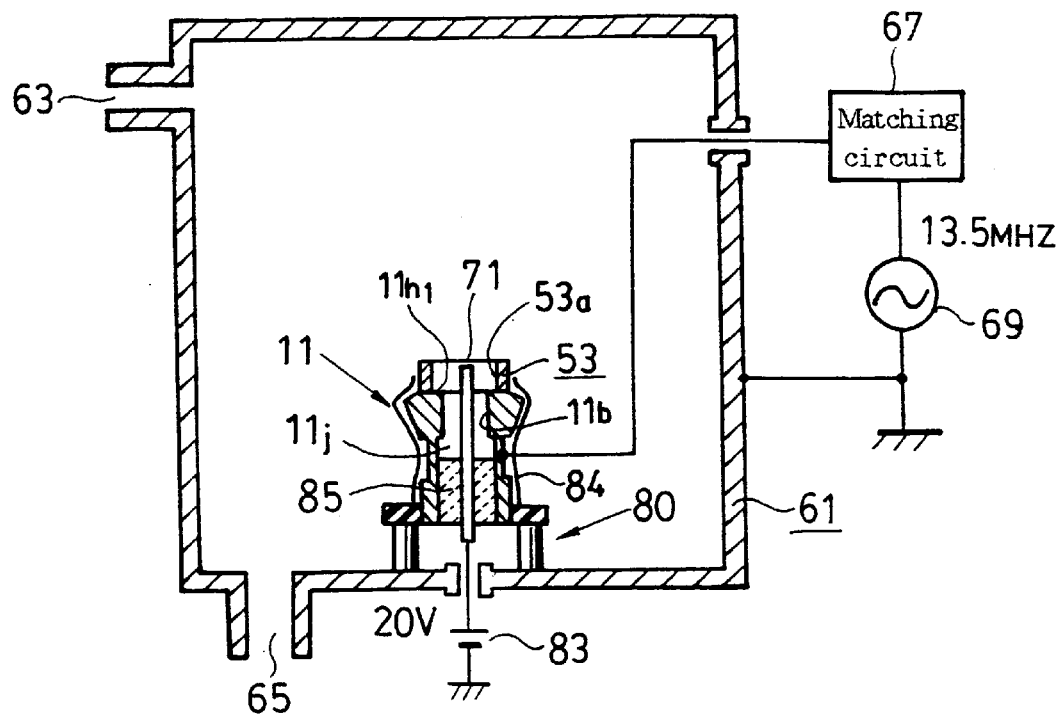
Figure 21:
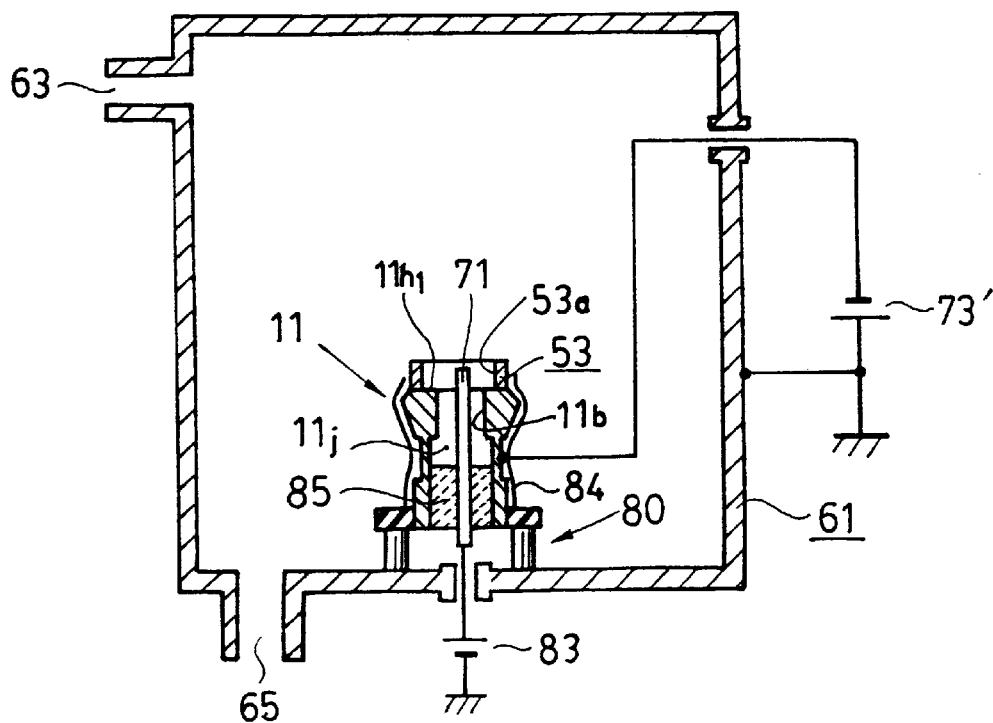

Fourth to Sixth Methods: FIGS. 19, 20, 21

The fourth and sixth hard carbon film forming methods in further preferred embodiments according to the present invention for forming a hard carbon film over a guide bush will be described with reference to FIGS. 19 to 21.

FIGS. 19 to 21 illustrate an apparatus for carrying out the fourth to sixth hard carbon film forming methods, respectively, each of which show an example of forming the hard carbon film on the guide bush 11 employing the same apparatus shown in FIGS. 15, 17 and 18, respectively. Therefore, parts like or corresponding to those shown in FIGS. 15, 17 and 18 are designated by the same reference characters and the description thereof will be omitted.

These fourth, fifth, and sixth hard carbon film forming methods using the apparatus shown in FIGS. 19, 20, and 21 are different from the foregoing first, second, and third methods in that the auxiliary electrode 71 is supported on an insulator 85 received in the center bore 11j of a guide bush 11 so that the auxiliary electrode 71 is insulated from both the guide bush 11 and the vacuum vessel 61, and a positive DC voltage of, for example, 20 V is applied to the auxiliary electrode 71 by an auxiliary electrode power source 83.

Figure 22:
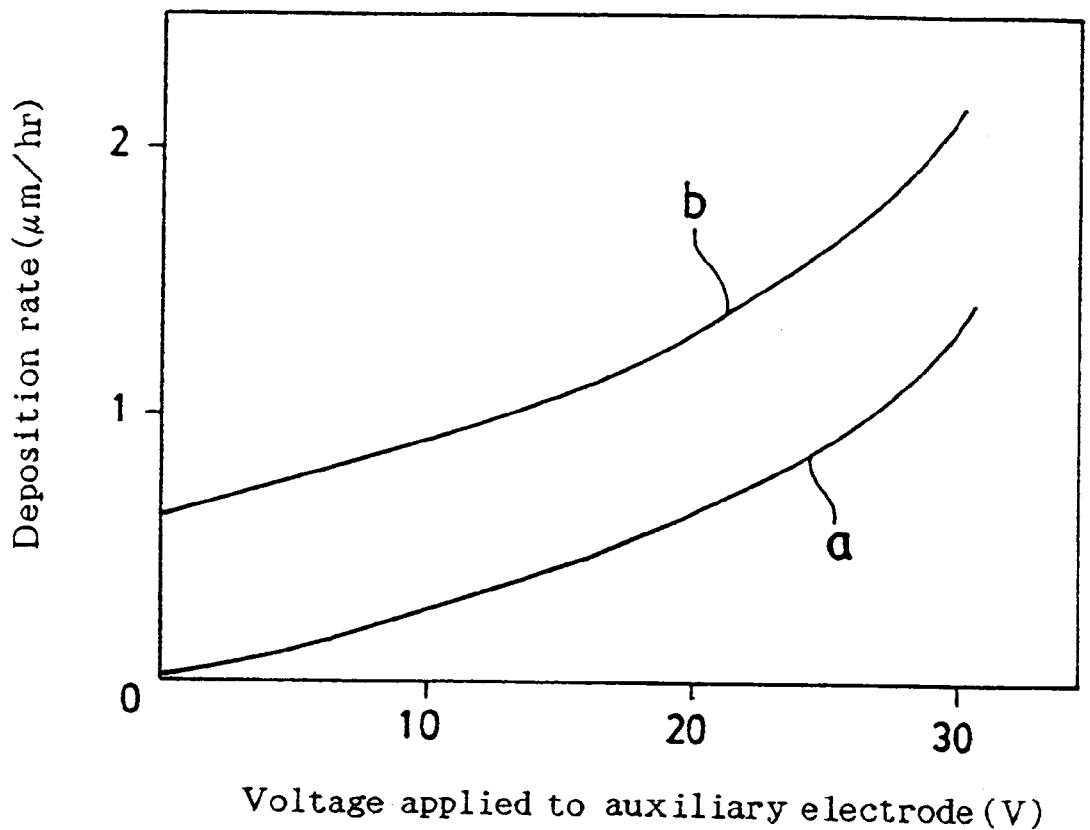
FIG. 22 is a linear graph showing the dependence of the thickness of a hard carbon film on a DC positive voltage applied to an auxiliary electrode.

FIG. 22 shows the dependence of the thickness of a hard carbon film formed on the inner surface of the guide bush 11 on the positive voltage applied to the auxiliary electrode 71.

In FIG. 22, the thickness of the hard carbon film is shown when the clearance between the inner surface of the guide bush 11 and the auxiliary electrode 71 is 3 mm and 5 mm while the positive DC voltage applied to the auxiliary electrode 71 was varied from 0 V to 30 V. Characteristic curves a and b are for the clearance of 3 mm and 5 mm, respectively.

It is known from the curves a and b that the rate of deposition of the hard carbon film increases as the positive DC voltage applied to the auxiliary electrode 71 increases and the rate of deposition of the hard carbon film is higher when the clearance between the inner surface of the bore of the guide bush 11 and the auxiliary electrode 11 is greater.

No plasma is produced around the inner surface of the center bore 11j of the guide bush 11 nor can any hard carbon film be formed when a voltage of 0 V is applied to the auxiliary electrode 71 and the potential of the auxiliary electrode 71 is equal to the ground voltage and the clearance between the inner surface of the bore of the guide bush and the auxiliary electrode 71 is 3 mm (curve a).

A plasma is produced around the auxiliary electrode 71 within the center bore 11j of the guide bush 11 and a hard carbon film can be formed when the positive DC voltage applied to the auxiliary electrode 71 is increased even when the clearance between the inner surface of the center bore 11j and the auxiliary electrode 71 is 3 mm.

Therefore, this hard carbon film forming method that applies a positive DC voltage to the auxiliary electrode 71 is able to form a hard carbon film over the inner surface of a guide bush having a center bore 11j of a small diameter.

All the hard carbon film forming methods illustrated in FIGS. 19 to 21 have the same effect.

Example of Different Dummy Member: FIGS. 23 to 28

Here, various embodiments of a dummy member 53 having an opening 53a of different shapes will be described with reference to FIGS. 23 to 28.

Figure 23:
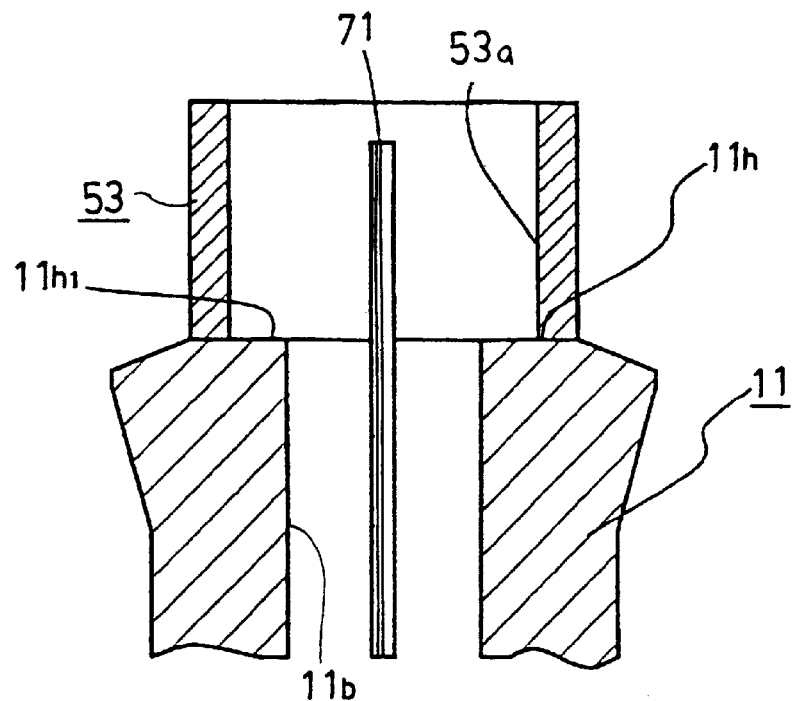
FIG. 23 to FIG. 28 are enlarged longitudinal sectional views of a main portion respectively showing a state where a dummy member having an inner surface of a different shape is disposed on the end face of a guide bush into which an auxiliary electrode is inserted.

The dummy member 53 shown in FIG. 23 corresponds to the one employed in the embodiment shown in FIGS. 15 to 21, and the diameter of the opening 53a is formed uniformly over the entire length of its axial direction.

Figure 24:
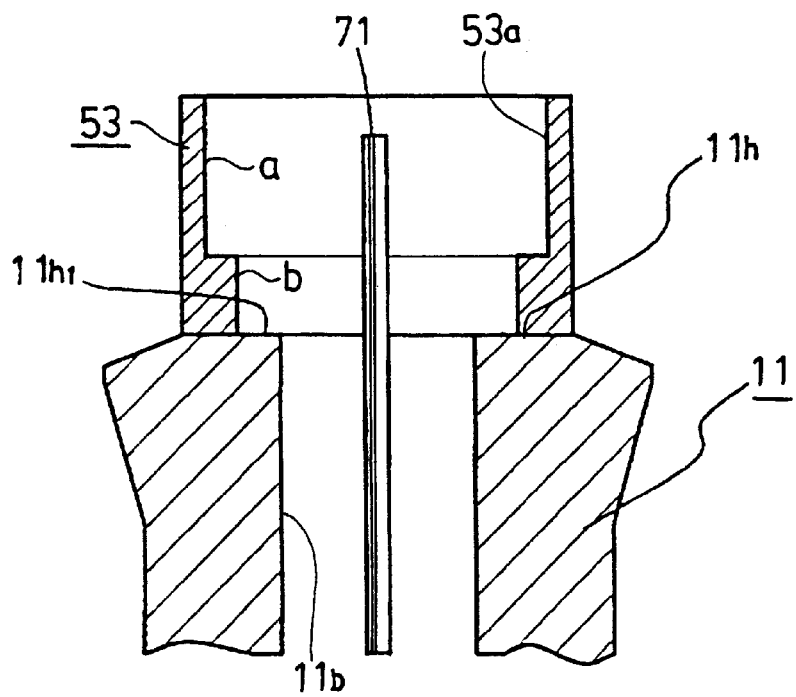

The dummy member 53 shown in FIG. 24 has an opening 53a comprises a large diameter portion a and a small diameter portion b. The diameter of the opening of the small diameter portion b is greater than that of the bore formed by the inner surface 11b of the guide bush 11 by about 2 mm, while the diameter of the opening of the large diameter portion a is further greater than that of the opening of the small diameter portion b by about 2 mm.

Figure 25:
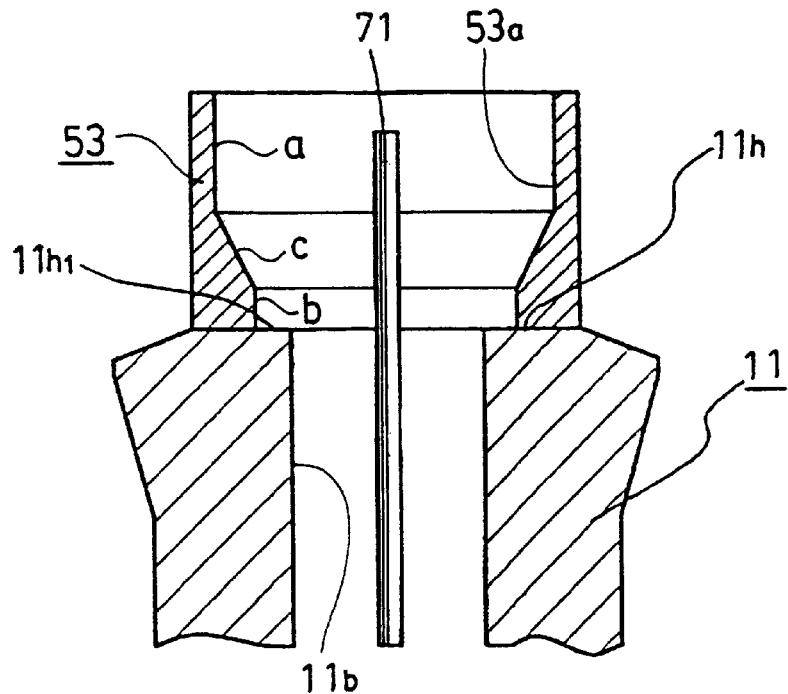

The dummy member 53 shown in FIG. 25 has an opening 53a comprising a large diameter portion a, a small diameter portion b, and a taper portion c between the large diameter portion a and the small diameter portion b. The diameter of the opening of the taper portion c is gradually varied so that the diameter of the opening of the small diameter portion b is greater than that of the opening of the inner surface 11b of the guide bush 11 by about 2 mm, and the diameter of the opening of the large diameter portion a is greater than that of the opening of the small diameter portion b by about 2 mm.

Figure 26:
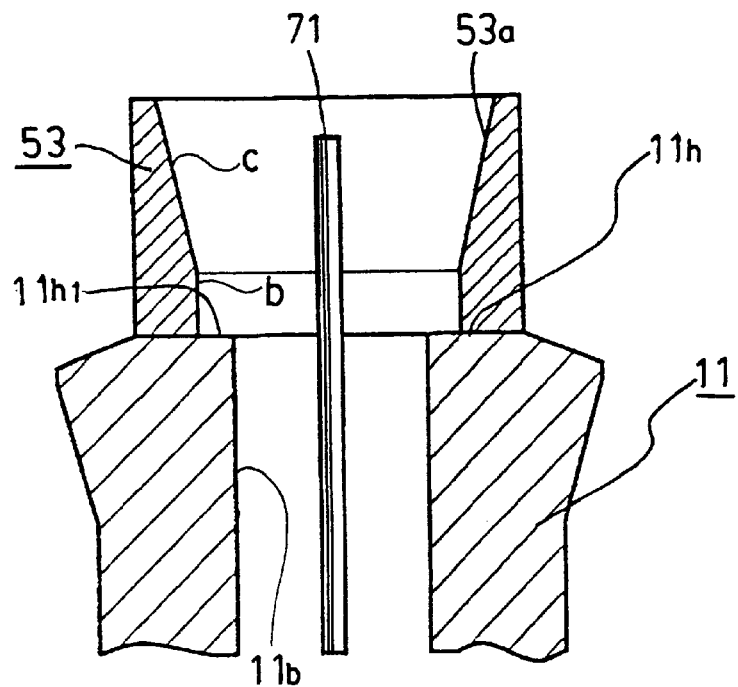

The dummy member 53 shown in FIG. 26 has an opening 53a comprising a small diameter portion b and a taper portion c. The diameter of the small diameter portion b is greater than that of the opening of the inner surface 11b of the guide bush 11 by about 2 mm, while the maximum diameter of the opening of the taper portion c is greater than that of the opening of the small diameter portion bby about 2 mm to 5 mm.

Figure 27:
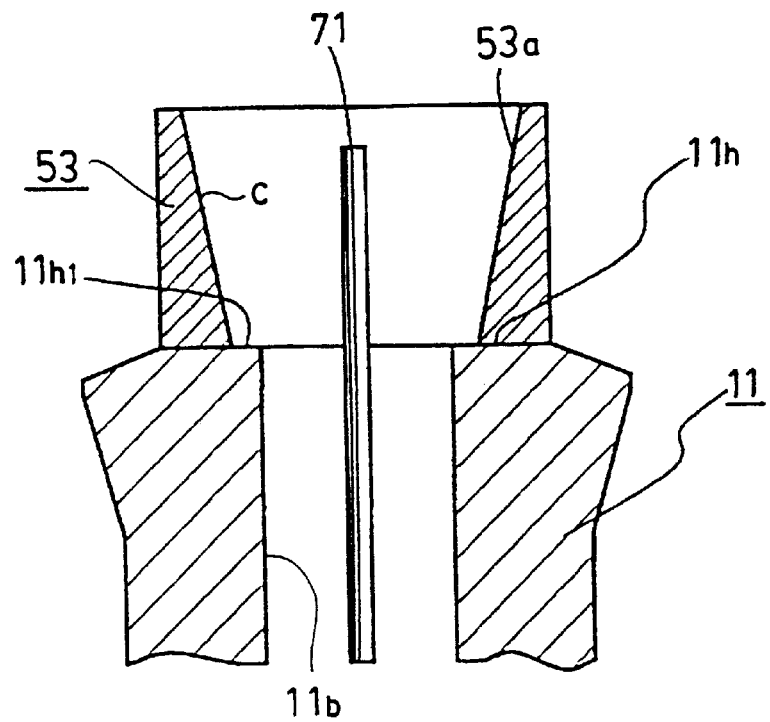

The dummy member 53 shown in FIG. 27 has an opening 53a comprising only a taper portion c. The minimum diameter of the opening of the taper portion is greater than that of the opening of the inner surface 11b of the guide bush 11 by about 2 mm, and the maximum diameter of the opening is greater than the minimum diameter of the opening by about 2 mm to 5 mm.

Figure 28:
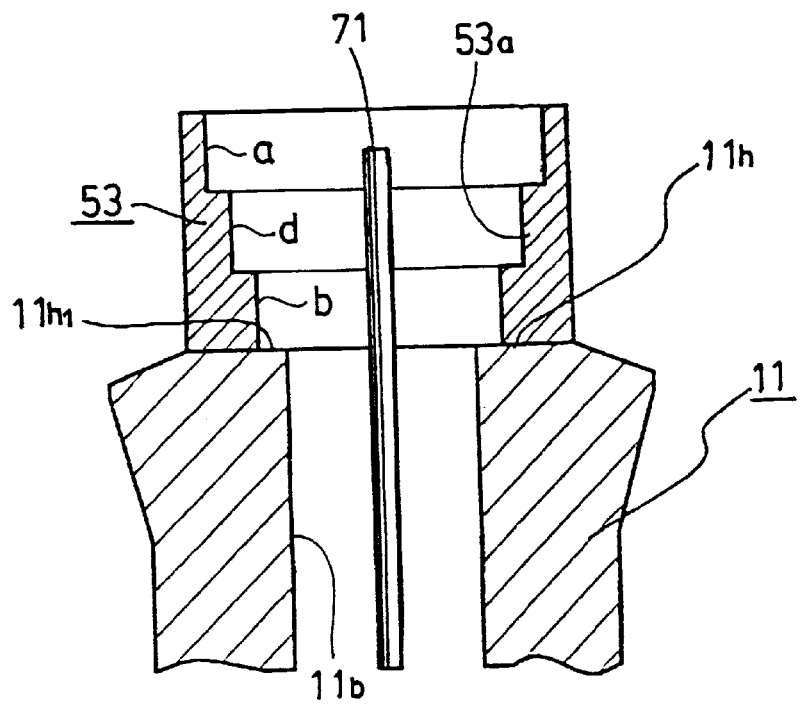

The dummy member 53 shown in FIG. 28 has an opening 53a comprising a large diameter portion a, an intermediate diameter portion d, and a small diameter portion b. The diameter of the opening of the small diameter portion b is greater than that of the inner surface 11b of the guide bush 11 by about 2 mm, and the diameter of the opening of the large diameter portion a is greater than that of the opening of the small diameter portion b by about 2 mm to 5 mm. The intermediate diameter portion d has an opening of a diameter in the range between the diameter of the opening of the large diameter portion a and the diameter of the opening of the small diameter portion b. Namely, the dummy member 53 has an opening 53a having an inner surface stepped in cross section.

The dummy member 53 shown in FIGS. 24 to 28 has a taper portion c and has a stepped inner surface, which makes the opening 53a differ from that of the dummy member 53 shown in FIG. 23, and hence it is possible to introduce a plasma smoothly into the region surrounding the auxiliary electrode 71 in the center bore 11j of the guide bush 11, as compared with the dummy member 53 shown in FIG. 23.

Accordingly, a plasma can be produced more stably around the region surrounding the auxiliary electrode 71 in the bore 11j of the guide bush 11, and the hard carbon film can be formed more stably.

Supplement Explanation

The method of forming a hard carbon film according to the various embodiments described before can be applied similarly to the formation of a hard carbon film 15 over various layers of the guide bush 11.

In the respective methods of forming the hard carbon film, the hard carbon film is not formed on the outer surface of the guide bush 11 by covering the outer region of the guide bush 11 with a covering member 84 or 94. Further, since regions other than the portion $11h_1$ of the end face 11h of the guide bush 11 adjacent to the end of the inner surface are covered with the dummy member 53, the hard carbon film is not formed thereon.

Thereby, the outer dimension of the guide bush 11 can be made accurate, and it is advantageous that the strength of the outer taper surface 11a formed with the slits 11c is prevented from being reduced.

However, even when the cover member 84 or 94 is not used when the hard carbon film is formed over the outer surface of the guide bush 11, no serious problem occurs.

Although the foregoing methods of forming a hard carbon film over a guide bush, according to the respective embodiments, use methane ($CH_4$) gas or benzene ($C_6H_6$) gas as a gas containing carbon, the hard carbon film forming methods may use ethylene ($C_2H_4$), hexane ($C_6H_{14}$) or the like.

These gases containing carbon may be diluted by an inert gas that is ionized at a relatively low ionization potential, such as argon (Ar) to stabilize the plasma produced in the center bore of the guide bush.

A small amount of an additive (1% or less) may be added to the gas containing carbon for forming the hard carbon film to enhance lubricity or hardness.

Addition of, for example, fluorine (F) or boron (B) to the gas containing carbon increases lubricity. Addition of, for example, chromium (Cr), molybdenum (Mo) or tungsten (W) to the gas. containing carbon increases hardness.

It is desirable to produce a plasma of argon (Ar) or nitrogen ($N_2$) after placing the guide bush in the vacuum vessel prior to forming the hard carbon film to bombard the inner surface of the guide bush, and to produce a plasma of the gas containing carbon, such as methane gas or benzene gas, for forming the hard carbon film.

This pretreatment using bombardment with an inert gas increases the temperature of the inner surface of the guide bush, activates the inner surface and drives out impurities from the inner surface of the guide bush to clean the inner surface. These effects further improve the adhesion of the hard carbon film to the inner surface of the hard carbon film.

Further, argon (Ar) gas, nitrogen ($N_2$) gas, helium (He) gas, or hydrogen ($H_2$) gas may be added to the methane gas, benzene gas or ethylene gas which contain carbon.

Thus, by adding argon gas or nitrogen gas to the gas containing carbon, the speed of forming the film can be controlled. Therefore, a dense hard carbon film can be formed, and further a hard carbon film with poor adhesion and quality can be removed by sputtering the surface of the hard carbon film using the nitrogen or the argon, thereby improving the quality of the film. Further, addition of hydrogen to the gas containing carbon is effective for improving the quality of the hard carbon film since dangling bonds of the carbon atoms can be filled with the hydrogen.

Although in the above description of the embodiments in the method of forming the hard carbon film according to the present invention, the hard carbon film is formed on the portion $11h_1$ of the end face of the guide bush 11 adjacent to the end of the inner surface extending by about 1 mm from the boundary region between the inner surface and the end face, the hard carbon film may be formed extending by more than 1 mm.

An example was also described in which the minimum diameter of the opening 53a of the dummy member 53 is larger than that of the bore formed by the inner surface 11b of the guide bush 11 by about 2 mm. However, the diameter of the opening 53a of the dummy member 53 may be larger than that of the bore formed by the inner surface 11b of the guide bush 11 by 3 mm to 6 mm. At this time also, the opening 53a of the dummy member 53 serves the same function as that in the aforementioned embodiment, and a similar effect can be obtained.

Furthermore, in the description of the above embodiments, the dummy member 53 is provided with an opening 53a having a diameter larger than that of the bore formed by the inner surface 11b as a measure against the unstable plasma discharge.

However, the present invention may be applied to a guide bush 11 having a bore formed by the inner surface 11b with a diameter larger than 10 mm with an object to make stable the plasma discharge produced between the auxiliary electrode 71 and the inner surface 11b of the guide bush 11.

INDUSTRIAL APPLICABILITY

As is apparent from the foregoing description, the guide bush according to the present invention provided with a hard carbon film on an inner surface which is in sliding contact with a workpiece and on a portion adjacent to an inner surface of the end face through which a workpiece is inserted and employed on the rotary or the stationary guide bush device of an automatic lathe enables the automatic lathe to carry out the normal machining of a workpiece at an increased depth of cut without damaging the workpiece or causing seizure between the guide bush and the workpiece, and enhances the machining efficiency of the automatic lathe remarkably. As well, flaws caused by flashes on the workpiece are prevented from being produced on the inner surface of the guide bush.

The remarkably enhanced durability of the guide bush extends the time for which machining can be continued, which increases the operation rate of the automatic lathe remarkably. When the guide bush is incorporated into the stationary guide bush device of an automatic lathe, the automatic lathe is able to achieve precision machining (particularly in roundness) efficiently.

According to the hard carbon film forming method of this invention, a hard carbon film over a guide bush is capable of forming a hard carbon film (DLC film) having uniform thickness and high adhesion over the inner surface of a guide bush that is brought into sliding contact with a workpiece and over a portion of the end face of the guide bush adjacent to the end of the inner surface in a short time.

Thus, the hard carbon film forming method is capable of manufacturing a durable guide bush for use on the guide bush device of an automatic lathe at a high productivity.

What is claimed is:

1. A method of forming a hard carbon film over a guide bush formed substantially in a cylindrical shape and having a center bore in its axial direction, further including a taper outer surface, an inner surface to be in sliding contact with a workpiece and slits provided at one end, the guide bush holding the workpiece inserted into the center bore rotatably and slidably in the axial direction near a cutting tool when the guide bush is mounted on an automatic lathe, wherein the guide bush is disposed in a vacuum vessel provided with a gas inlet port and an evacuation port;

an auxiliary electrode is inserted into the center bore forming the inner surface of the guide bush and is connected to a ground potential;

a ringlike dummy member having an opening of a diameter larger than that of the center bore of the guide bush is placed on an end face of the guide bush boring at the end of the inner surface with its axis in alignment with that of the center bore so as to expose a portion of the end face adjacent to the inner surface annularly;

a gas containing carbon is introduced through the gas inlet port into the vacuum vessel after evacuating the vacuum vessel; and a plasma is produced in the vacuum vessel to form a hard carbon film of hydrogenated amorphous carbon over the inner surface of the guide bush and over a portion of the end face of the guide bush adjacent to the end of the inner surface with a plasma CVD method.

2. The method of forming a hard carbon film over a guide bush claimed in claim 1, wherein said vacuum vessel is provided with an anode and a filament therein, and a plasma is produced in the vacuum vessel by applying a DC voltage to the guide bush, a DC voltage to the anode, and an AC voltage to the filament, respectively.

3. The method of forming a hard carbon film over a guide bush claimed in claim 1, wherein a plasma is produced in the vacuum vessel by applying a radio frequency power to the guide bush.

4. The method of forming a hard carbon film over a guide bush claimed in claim 1, wherein a plasma is produced in the vacuum vessel by applying a DC voltage to the guide bush.

5. A method of forming a hard carbon film over a guide bush formed substantially in a cylindrical shape and having a center bore in its axial direction, further including a taper outer surface, an inner surface to be in sliding contact with a workpiece and slits provided at one end, the guide bush holding the workpiece inserted into the center bore rotatably and slidably in the axial direction near a cutting tool when the guide bush is mounted on an automatic lathe, wherein the guide bush is disposed in a vacuum vessel provided with a gas inlet port and an evacuation port;

an auxiliary electrode is inserted into the center bore forming the inner surface of the guide bush to which is applied a positive DC voltage;

a ringlike dummy member having an opening of a diameter larger than that of the center bore of the guide bush is placed on an end face of the guide bush boring at the inner surface with its axis in alignment with that of the center bore so as to expose a portion of the end face adjacent to the inner surface annularly;

a gas containing carbon is introduced through the gas inlet port into the vacuum vessel after evacuating the vacuum vessel; and a plasma is produced in the vacuum vessel to form a hard carbon film of hydrogenated amorphous carbon over the inner surface of the guide bush and over a portion of the end face of the guide bush adjacent to the end of the inner surface with a plasma CVD method.

6. The method of forming a hard carbon film over a guide bush claimed in claim 5, wherein said vacuum vessel is provided with an anode and a filament therein, and a plasma is produced in the vacuum vessel by applying a DC voltage to the guide bush, a DC voltage to the anode, and an AC voltage to the filament, respectively.

7. The method of forming a hard carbon film over a guide bush claimed in claim 5, wherein a plasma is produced in the vacuum vessel by applying a radio frequency power to the guide bush.

8. The method of forming a hard carbon film over a guide bush claimed in claim 5, wherein a plasma is produced in the vacuum vessel by applying a DC voltage to the guide bush.

9. A guide bush formed substantially in a cylindrical shape and having a center bore in its axial direction, including a taper outer surface, an inner surface to be in sliding contact with a workpiece and slits provided at one end, the guide bush holding the workpiece inserted into the center bore rotatably and slidably in the axial direction near a cutting tool when the guide bush is mounted on an automatic lathe, wherein a hard carbon film of hydrogenated amorphous carbon is formed on an inner surface of the center bore and on a portion of an end face of the guide bush adjacent to the end of the inner surface boring at the end face.

10. A guide bush according to claim 9, wherein the hard carbon film is formed on the inner surface of the center bore and on the portion of the end face of the bore adjacent to the inner surface by way of an intermediate layer for enhancing adhesion with the hard carbon film.

11. A guide bush according to claim 10, wherein the intermediate layer is formed of a two-layer film consisting of a lower layer of titanium or chromium and an upper layer of silicon carbide.

12. A guide bush formed substantially in a cylindrical shape and having a center bore in its axial direction, including a taper outer surface, an inner surface to be in sliding contact with a workpiece and slits provided at one end, the guide bush holding the workpiece inserted into the center bore rotatably and slidably in the axial direction near a cutting tool when the guide bush is mounted on an automatic lathe, wherein a superhard lining containing at least tungsten, carbon and cobalt is provided on the inner surface of the center bore, and a hard carbon film of hydrogenated amorphous carbon is formed on an inner surface of the superhard lining and on an end face of the superhard lining boring at the inner surface.

13. A guide bush according to claim 10, wherein the hard carbon film is formed on the superhard lining by way of an intermediate layer for enhancing adhesion with the hard carbon film.

14. A guide bush according to claim 13, wherein the intermediate layer is formed of a two-layer film consisting of a lower layer of titanium or chromium and an upper layer of silicon carbide.

15. A guide bush according to claim 13, wherein the intermediate layer is formed of a carbonated tungsten film.

16. A guide bush according to claim 13, wherein the intermediate layer is formed of a two-layer film consisting of a lower layer of carbonated tungsten and an upper layer of silicon carbide.

17. A guide bush formed substantially in a cylindrical shape and having a center bore in its axial direction, including a taper outer surface, an inner surface to be in sliding contact with a workpiece and slits provided at one end, the guide bush holding the workpiece inserted into the center bore rotatably and slidably in the axial direction near a cutting tool when the guide bush is mounted on an automatic lathe, wherein a carburized layer is provided on an inner surface of the center bore and on a portion of an end face of the guide bush adjacent to the end of the inner surface boring at the end face, and a hard carbon film of hydrogenated amorphous carbon is formed on the carburized layer.

18. A guide bush according to claim 17, wherein the hard carbon film is formed on the carburized layer by way of an intermediate layer for enhancing adhesion with the hard carbon film.

19. A guide bush according to claim 18, wherein the intermediate layer is formed of a two-layer film consisting of a lower layer of titanium or chromium and an upper layer of silicon carbide.

* * * * *